(12) United States Patent
Yang

(10) Patent No.: US 12,292,489 B2
(45) Date of Patent: May 6, 2025

(54) PIN DIODE CURRENT REDUCTION FOR MRI TRANSMIT COILS

(71) Applicant: Quality Electrodynamics, LLC, Mayfield Village, OH (US)

(72) Inventor: Xiaoyu Yang, Indiana, PA (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 146 days.

(21) Appl. No.: 18/179,475

(22) Filed: Mar. 7, 2023

(65) Prior Publication Data

US 2023/0296705 A1    Sep. 21, 2023

Related U.S. Application Data

(60) Provisional application No. 63/320,368, filed on Mar. 16, 2022.

(51) Int. Cl.
*G01R 33/34* (2006.01)
*G01R 33/341* (2006.01)
*G01R 33/36* (2006.01)

(52) U.S. Cl.
CPC ..... *G01R 33/341* (2013.01); *G01R 33/34076* (2013.01); *G01R 33/3657* (2013.01)

(58) Field of Classification Search
CPC ............ G01R 33/341; G01R 33/34076; G01R 33/3657; G01R 33/365
See application file for complete search history.

(56) References Cited

U.S. PATENT DOCUMENTS

| 4,694,255 | A | | 9/1987 | Hayes | |
|---|---|---|---|---|---|
| 5,278,505 | A | * | 1/1994 | Arakawa | G01R 33/341 324/322 |
| 2013/0207660 | A1 | | 8/2013 | Lips | |
| 2016/0033594 | A1 | * | 2/2016 | Yang | G01R 33/3657 324/322 |

* cited by examiner

*Primary Examiner* — G. M. A Hyder
(74) *Attorney, Agent, or Firm* — Eschweiler & Potashnik, LLC

(57) ABSTRACT

Various embodiments of the present disclosure are directed to a magnetic resonance imaging (MRI) radio frequency (RF) coil comprising a current-control circuit. A conductive trace forms a coil inductor and comprises a first trace segment and a second trace segment separated by the current-control circuit, which comprises a first reactive element and a circuit branch. The first reactive element is electrically coupled from the first trace segment to the second trace segment, and the circuit branch is electrically coupled in parallel with the first reactive element. The circuit branch comprises a second reactive element and a sub-circuit branch electrically coupled in parallel. The sub-circuit branch comprises a third reactive element and an electronic switch (e.g., a PIN diode) electrically coupled in series. The first reactive element and the third reactive element are one of capacitive and inductive, and the second reactive element is another one of capacitive and inductive.

20 Claims, 18 Drawing Sheets

US 12,292,489 B2

PIN DIODE CURRENT REDUCTION FOR MRI TRANSMIT COILS

REFERENCE TO RELATED APPLICATION

This application claims the benefit of U.S. Provisional Application No. 63/320,368, filed on Mar. 16, 2022, the contents of which are incorporated by reference in their entirety.

BACKGROUND

Magnetic resonance imaging (MRI) involves the transmission and receipt of radio frequency (RF) energy. RF energy may be transmitted by an RF coil to a create a $B_1$ field that rotates a net magnetization. Further, resulting magnetic resonance (MR) signals may be received by an RF coil to detect precessing transverse magnetization. Thus, RF coils may be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
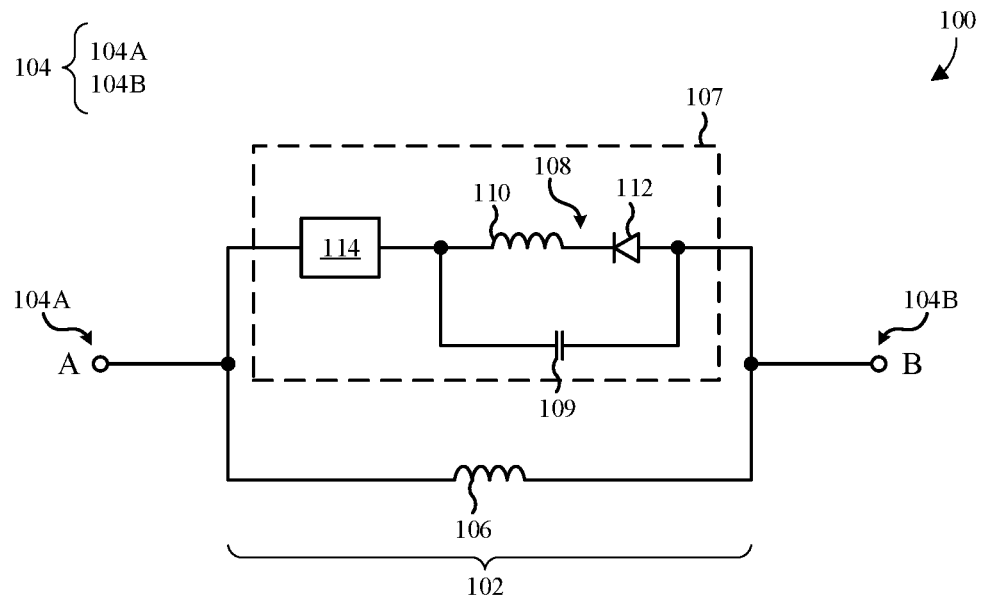
FIG. 1 is a circuit diagram illustrating a first embodiment of a current-control circuit for reducing PIN diode current in a radio frequency (RF) coil.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Commercial magnetic resonance imaging (MRI) systems, from low field (e.g., 0.3 Tesla (T)) commercial MRI systems to high field (e.g., 3T) commercial MRI systems, use built-in transmit (Tx) coils (e.g., whole body coils (WBCs)), regardless of whether vertical or horizontal. Further, the Tx coils are often used with high peak radio frequency (RF) power and high root mean square (RMS) RF power. For example, a Tx coil for a commercial MRI system with a 70 centimeter (cm), horizontal patient aperture (PA) may be used with 30 kilowatt (kW) peak RF power. Thus, the RF current through the Tx coils is high.

For a horizontal MR system, a Tx coil is typically a birdcage coil with a RF shield. In Tx mode, the Tx coil is ON and in resonance at the working frequency (e.g., the Larmor frequency) to generate a $B_1+$ field. In receive (Rx) mode, if the Tx coil is not the Rx coil, the Tx coil is OFF and not in resonance or is otherwise disabled. The ON and OFF function of the Tx coil may be realized by PIN diodes. For example, multiple PIN diodes may be put on rungs and rings of the birdcage coil to control the ON and OFF function.

Over the past two decades, MRI system development has been toward larger PA systems. 60 cm PA systems were popular 20 years ago. Nowadays, 70 cm PA systems are the market standard and 80 cm PA systems have started to appear in the market. These large PA systems pose challenges for Tx coils because the RF current in the Tx coils becomes larger. For example, for a 16 rung high pass birdcage WBC of a 70 cm PA system, the RMS RF current in the WBC can be around 7-8 amps (A) and the peak RF current in the WBC can be 70 A or more. In contrast, for a similar WBC in a 80 cm PA system, the RF current could be doubled.

Current flowing in a Tx coil flows through PIN diodes of the Tx coil in Tx mode. Further, the ON resistance of such PIN diodes may, for example, be 0.1 Ohm. Therefore, if 8 A flows through a PIN diode of the Tx coil, the generated heat is 6.4 watts (W). If the current doubles, the generated heat quadruples to 25.6 W. As such, the heat becomes a serious issue for PIN diode reliability. To address the issue, higher power PIN diodes may be used or more rungs/PIN diodes may be used to share the same current. However, higher power PIN diodes or more PIN diodes are expensive and therefore increase the coil cost. The present disclosure provides a novel solution to address this challenge without a large cost increase.

FIG. 1 illustrates a circuit diagram 100 including a first embodiment of a current-control circuit 102 for reducing PIN diode current in an RF coil. The RF coil may, for example, be an MRI RF coil or the like. A conductive trace 104 forms a coil inductor of the RF coil. Further, the conductive trace 104 comprises a first trace segment 104A and a second trace segment 104B spaced from each other. In some embodiments, the conductive trace 104 is or comprises one or more strips of copper or the like printed or otherwise adhered to a dielectric substrate.

The current-control circuit 102 comprises a first reactive element 106 and a circuit branch 107. The first reactive element 106 and the circuit branch 107 separate the first trace segment 104A from the second trace segment 104B. The first reactive element 106 is electrically coupled from the first trace segment 104A to the second trace segment 104B. The circuit branch 107 is electrically coupled in parallel with the first reactive element 106. The circuit branch 107 comprises a sub-circuit branch 108 and a second reactive element 109 electrically coupled in parallel with the sub-circuit branch 108. The sub-circuit branch 108 comprises a third reactive element 110 and a PIN diode 112 electrically coupled in series. The PIN diode 112 is electrically coupled so there is no electrical element electrically coupled in parallel with the PIN diode 112. The PIN diode 112 may more generally be referred to as an electronic switch and, in alternative embodiments, may be some other suitable type of electronic switch.

The first reactive element 106 and the third reactive element 110 have a first reactance type (e.g., inductive or capacitive), and the second reactive element 109 has a second reactance type (e.g., capacitive or inductive) different from the first reactance type. For example, the first reactive element 106 and the third reactive element 110 are illustrated in FIG. 1 as inductors, whereas the second reactive element 109 is illustrated as a capacitor.

The second reactive element 109 and the third reactive element 110 are configured to resonate at a working frequency when the PIN diode 112 is ON and hence the second reactive element 109 and the third reactive element 110 are electrically coupled in parallel. In the case of MRI, the working frequency corresponds to a Larmor frequency. For the illustrated case in which the second reactive element 109 is a capacitor and the third reactive element 110 is an inductor, such resonance may, for example, be achieved when a capacitance of the second reactive element 109 and an inductance of the third reactive element 110 are selected so as satisfy $$f = \frac{1}{2\pi\sqrt{LC}},$$

where f is the working frequency, L is the inductance, and C is the capacitance.

As explained hereafter in greater detail, the resonance is used to create a high impedance path so that the large Tx coil current mainly goes through the first reactive element 106 during a Tx mode of the RF coil. The high impedance path can reduce current flow in the PIN diode 112 with the right choice of the third reactive element 110, thereby reducing heat dissipation in the PIN diode 112. The reduced current flow and the reduced heat dissipation increase a lifespan of the PIN diode 112. Further, the reduced current flow and the reduced heat dissipation allow for larger PA MRI systems without turning to higher power PIN diodes and/or more PIN diodes. Such larger PA MRI systems may, for example, include MRI systems with a PA of 80 cm or more. By reducing dependance on higher power PIN diodes and/or on more PIN diodes, manufacturing costs may be reduced.

In some embodiments, the first reactive element 106 corresponds to an additional trace segment of the conductive trace 104, which extends from the first trace segment 104A to the second trace segment 104B. In such embodiments, the first reactive element 106 contributes to an RF field created by the RF coil in Tx mode and hence enhances transmit efficiency in Tx mode. In alternative embodiments, the first reactive element 106 corresponds to a discrete device. In such alternative embodiments, the first reactive element 106 does not contribute to or minimally contributes to the RF field. In some embodiments, the third reactive element 110 and the second reactive element 109 correspond to discrete devices.

The circuit branch 107 further comprises an electrical element 114 electrically coupled in series with a parallel combination of the sub-circuit branch 108 and the second reactive element 109. The electrical element 114 may, for example, be an electrical short or a fourth reactive element. The fourth reactive element may, for example, be an inductive element (e.g., an inductor) or a capacitive element (e.g., a capacitor). However, practically, the electrical element 114 is the fourth reactive element and is of a same reactivity type (e.g., inductive or capacitive) as the third reactive element 110. For example, the electrical element 114 may be an inductor in the illustrated case. Otherwise, there may be no reduction in current through the PIN diode 112 as explained hereafter with regard to FIGS. 6A-6C.

The first reactive element 106 and the second reactive element 109, as well as the electrical element 114 when reactive, are configured to resonate at the working frequency when the PIN diode 112 is OFF and hence the first reactive element 106 is electrically coupled in parallel with a series combination of the electrical element 114 and the second reactive element 109. As noted above, in the case of MRI, the working frequency corresponds to the Larmor frequency. Such resonance is used to create a high impedance path during a Rx mode of the RF coil. As seen hereafter, the high impedance path stops current flow in the RF coil, thereby decoupling the RF coil from other RF coils that may be used in Rx mode. This, in turn, prevents the RF coil from interfering with the receipt of RF signals by the other RF coils.

To the extent that the electrical element 114 is an electrical short, the first reactive element 106 and the second reactive element 109 are configured to resonate with each other at the working frequency to achieve coil decoupling in Rx mode. For example, the second reactive element 109 is a capacitor, the first reactive element 106 is an inductor, and the electrical element 114 is a short. In practice, no PIN diode current reduction may be achieved in Tx mode in this scenario. However, it is considered for theoretical purposes.

To the extent that the electrical element 114 is inductive, the electrical element 114 is further configured to resonate with the first reactive element 106 and the second reactive element 109 at the working frequency. For example, the second reactive element 109 is a capacitor, the first reactive element 106 is an inductor, and the electrical element 114 is an inductor. This scenario is advantageous, since coil decoupling is achieved in Rx mode and PIN diode reduction is achieved in Tx mode.

To the extent that the electrical element 114 is capacitive, the electrical element 114 is further configured to resonate with the first reactive element 106 and the second reactive element 109 at the working frequency to achieve coil decoupling in Rx mode. For example, the second reactive element 109 is a capacitor, the first reactive element 106 is an inductor, and the electrical element 114 is a capacitor. In practice, no PIN diode current reduction may be achieved in Tx mode in this scenario. However, it is considered for theoretical purposes.

In some embodiments, the electrical element 114 corresponds to an additional trace segment of the conductive trace 104, which extends from the first trace segment 104A to the parallel combination of the sub-circuit branch 108 and the second reactive element 109. In alternative embodiments, the electrical element 114 corresponds to a discrete device.

In some embodiments, the first reactive element 106 is an inductor with an inductance of about 47 nanohenry (nH), the second reactive element 109 is a capacitor with a capacitance of about 17.82 picofarad (pF), and the third reactive element 110 is an inductor with an inductance of about 94 nH. In some of such embodiments, the electrical element 114 is an electrical short or a capacitor. In other of such embodiments, the electrical element 114 is an inductor with an inductance of about 47 nH. As explained in detail hereafter, because of the 2:1 ratio between the inductance of the third reactive element 110 and the inductance of the first reactive element 106, a current reduction of approximately 50% through the PIN diode 112 may result.

Figure 2A:
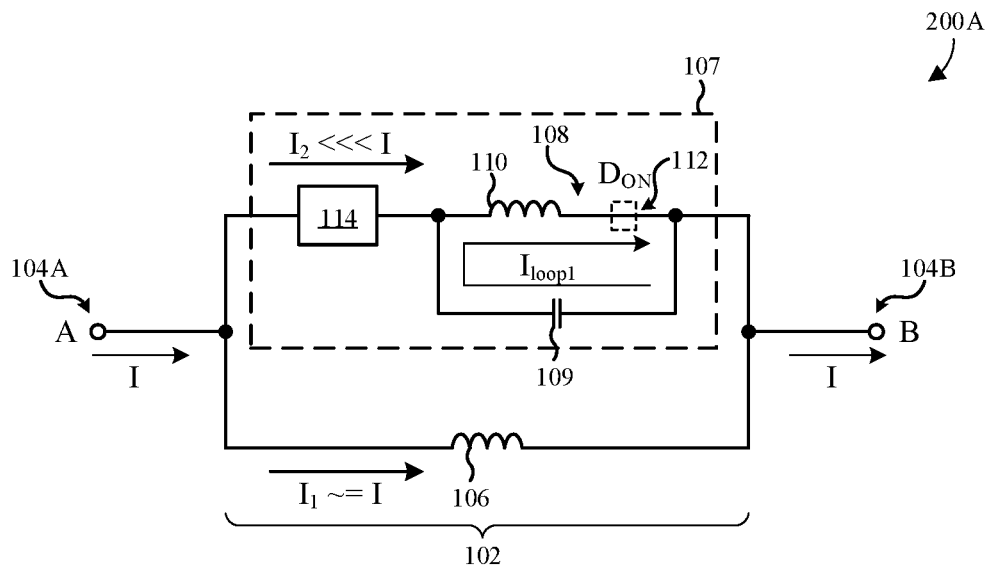
FIGS. 2A and 2B are circuit diagrams illustrating operation of the current-control circuit of FIG. 1 when the PIN diode is ON and OFF respectively.

FIG. 2A illustrates operation 200A of the circuit diagram 100 of FIG. 1 when the RF coil is in Tx mode. In the case of MRI, the RF coil transmits RF energy to create a $B_1$ magnetic field in Tx mode. During the Tx mode, a current I flows through the conductive trace 104, from the first trace segment 104A to the second trace segment 104B, at the working frequency. Because of multiple parallel paths, the current I splits into a first current $I_1$ that flows through the first reactive element 106, and a second current $I_2$ that flows through the circuit branch 107.

Further, during the Tx mode, the PIN diode 112 is switched ON. When ON, the PIN diode 112 has a low resistance. For example, the PIN diode 112 may have a resistance of around 0.1 Ohm, less than 0.1 Ohm, about 0.05-0.15 Ohm, or some other suitable value. Hence, the PIN diode 112 is treated as an electrical short for ease of discussion.

Because the PIN diode 112 is ON in the Tx mode, the second reactive element 109 and the third reactive element 110 are electrically coupled in parallel. Further, as described above, the second reactive element 109 and the third reactive element 110 are selected so the second reactive element 109 and the third reactive element 110 resonate with each other at the working frequency. This creates a high impedance that limits current flow through the circuit branch 107 and hence through the PIN diode 112. Because of the high impedance, a majority of current flows through the first reactive element 106 as opposed to the circuit branch 107. For example, 99% or more of the current I flows through the first reactive element 106.

To better understand why the high impedance results, note the second reactive element 109 and the third reactive element 110 are illustrated respectively as a capacitor and an inductor and hence have a capacitance C and an inductance L. In that case, the second reactive element 109 has an impedance $$Z_C = jX_C = -j\frac{1}{wC},$$

where $X_C$ corresponds to a reactance of the second reactive element 109. Further, the third reactive element 110 has an impedance $Z_L=jX_L=jwL$, where $X_L$ corresponds to a reactance of the third reactive element 110. Further, note that the second reactive element 109 and the third reactive element 110 are selected to resonate with each other at the working frequency. Because the second reactive element 109 and the third reactive element 110 have a resonant frequency equal to the working frequency, $X_L$ and $X_C$ sum to zero at the working frequency and hence $X_L$ is equal to $-X_C$ at the working frequency. Further, because the second and third reactive elements 109, 110 have no meaningful resistance, $Z_L$ and $Z_C$ sum to zero at the working frequency and hence $Z_L$ is equal to $-Z_C$ at the working frequency.

With the foregoing in mind, a total impedance $Z_{tot}$ for the parallel combination of the second reactive element 109 and the third reactive element 110 may be written as follows.

$$Z_{tot} = \frac{1}{\frac{1}{Z_L}+\frac{1}{Z_C}} = \frac{1}{\frac{1}{Z_L}-\frac{1}{Z_L}} = \frac{1}{0}$$

Hence, the impedance of the second reactive element 109 and the impedance of the third reactive element 110 cancel each other in the denominator, resulting in division by zero. Because of the division by zero, the total impedance is theoretically infinite. However, in practice, the resistive loss of the third reactive element 110, the second reactive element 109, and the PIN diode 112 are not zero and hence result in the high impedance. Such a high impedance may, for example, be greater than 1 kiloohms, 2 kiloohms, or more.

The above approach to calculating the conditions for generating a high impedance can be generalized to any parallel circuit with two branches. Modifying the above equation, $Z_1$ and $Z_2$ may be substituted in place of $Z_L$ and $Z_C$ to produce the following equation.

$$Z_{tot} = \frac{1}{\frac{1}{Z_L}+\frac{1}{Z_2}} = \frac{1}{0}$$

The high impedance results when $Z_1=-Z_2$ (e.g., when the denominator of $Z_{tot}$ approaches 0), where $Z_1$ represents the impedance of the first parallel-circuit branch, and $Z_2$ represents the impedance of the second parallel-circuit branch.

This modified equation may be applied to the various embodiments provided throughout the present disclosure in order to determine capacitance and/or inductance values that will result in parallel resonance at the working frequency.

In some embodiments, the first reactive element 106 is an inductor with an inductance of about 47 nH, the second reactive element 109 is a capacitor with a capacitance of about 17.82 pF, the third reactive element 110 is an inductor with an inductance of about 94 nH, and the electrical element 114 is an inductor with an inductance of about 47 nH. In some of such embodiments, the high impedance may, for example, be about 6.5 kiloohms at a resonant frequency of 123 megahertz. Other suitable values are, however, amenable.

Despite current flow through the circuit branch 107 being reduced to zero or almost zero by the high impedance, there may be higher current flow through the PIN diode 112. At resonance, energy is constantly transferred back and forth between the second reactive element 109 and the third reactive element 110. The resonance between the second reactive element 109 and the third reactive element 110 creates a first loop current $I_{loop1}$ that has a greater magnitude than current flow through the circuit branch 107.

A magnitude of the first loop current $I_{loop1}$ may be determined by a ratio between an impedance of the first reactive element 106 and an impedance of the third reactive element 110. For example, supposing an impedance of the first reactive element 106 is half an impedance of the third reactive element 110, a magnitude of the first loop current $I_{loop1}$ may be half a magnitude of the first current $I_1$ through the first reactive element 106.

To better understand this relationship between current and impedance, note the first reactive element 106 and the third reactive element 110 are illustrated respectively as inductors and hence have a first inductance $L_1$ and a second inductance $L_2$. Further, note that the impedance across the electrical element 114 is significantly less than an impedance across a parallel combination of the second reactive element 109 and the third reactive element 110. Hence, the electrical element 114 may be ignored, and a voltage across the first, second, and third reactive elements 106, 109, 110 may be treated as the same, for ease of discussion. Such voltage is hereafter referred to as a voltage $V_{AB}$, though this is a simplification as noted above.

With the foregoing in mind, the first current $I_1$ may be written as $$I_1 = \frac{V_{AB}}{Z_1}$$

and the first loop current $I_{loop1}$ may be written as $$I_{loop1} = \frac{V_{AB}}{Z_2},$$

where $Z_1$ corresponds to an impedance of the first reactive element 106 and $Z_2$ corresponds to an impedance of the third reactive element 110. Further, because the first reactive element 106 and the third reactive element 110 are inductors, the impedance $Z_1$ of the first reactive element 106 may be written as $Z_1=jwL_1$ and the impedance of the third reactive element 110 may be written as $Z_2=jwL_2$.

A ratio of the first loop current $I_{loop1}$ to the first current $I_1$ may then be written as follows.

$$\frac{I_{loop1}}{I_1} = \frac{\frac{V_{AB}}{Z_2}}{\frac{V_{AB}}{Z_1}} = \frac{\frac{V_{AB}}{jwL_2}}{\frac{V_{AB}}{jwL_1}} = \frac{jwL_1}{jwL_2} = \frac{L_1}{L_2}$$

Hence, a ratio of the first loop current $I_{loop1}$ to the first current $I_1$ is equal to a ratio of the first inductance $L_1$ to the second inductance $L_2$. Further, the first loop current $I_{loop1}$ may be simplified to a product of the first current I and the inductance ratio as follows.

$$I_{loop1} = \frac{L_1}{L_2} I_1$$

Because almost all of the current I flows through the first reactive element 106 due to the high impedance, the current I may be treated as approximately equal to the first current $I_1$ for ease of discussion. Hence, the first loop current $I_{loop1}$ may be further simplified as follows.

$$I_{loop1} = \frac{L_1}{L_2} I$$

Therefore, as seen, the first loop current $I_{loop1}$ varies by a ratio of the first inductance $L_1$ to the second inductance $L_2$. For example, if the second inductance $L_2$ is twice the first inductances $L_1$, the current through the first loop current $I_{loop1}$ is half of the current I. Hence, there is a 50% reduction in current through the PIN diode 112. As another example, if the second inductance $L_2$ is three times the first inductances $L_1$, the current through the first loop current $I_{loop1}$ is a third of the current I. Hence, there is a 66% reduction in current through the PIN diode 112. In some embodiments, the larger current reduction ratio, the more blocking impedance there is from the first trace segment 104A to the second trace segment 104B.

Figure 2B:
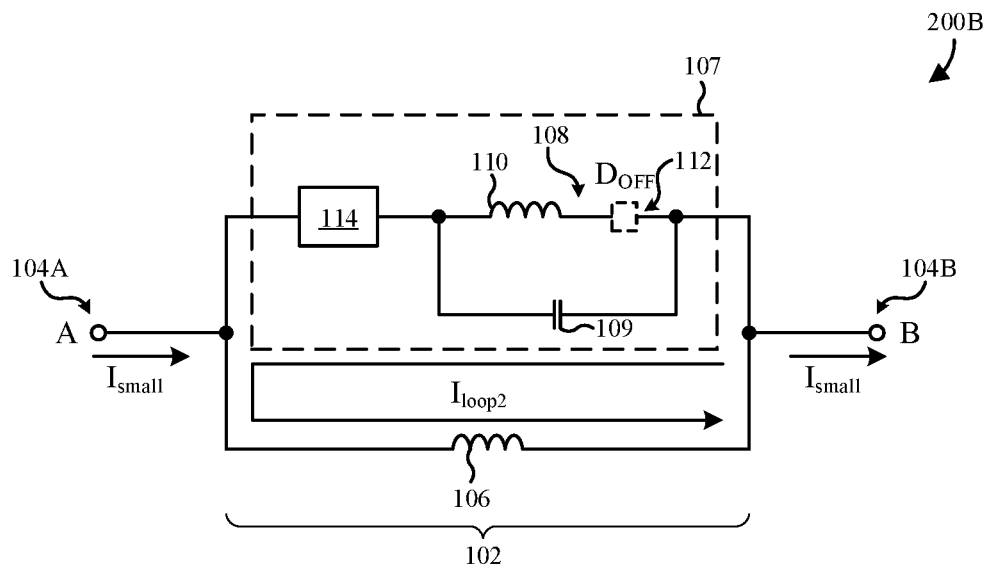

FIG. 2B illustrates operation 200B of the circuit diagram 100 of FIG. 1 when the RF coil is in Rx mode. In the case of MRI, the RF coil is disabled or otherwise decoupled from other RF coils. During the Rx mode, no current or a small current Ismail flows through the conductive trace 104, from the first trace segment 104A to the second trace segment 104B, at the working frequency. Further, during the Rx mode, the PIN diode 112 is switched OFF. When OFF, the PIN diode 112 has a high resistance. Hence, the PIN diode 112 is treated as an open circuit for ease of discussion. Because the PIN diode 112 is treated as an open circuit, the third reactive element 110 may be ignored and the circuit branch 107 is effectively a series combination of the electrical element 114 and the second reactive element 109. Further, the series combination is electrically coupled in parallel with the first reactive element 106.

As described above, the first reactive element 106, the electrical element 114, and the second reactive element 109 are selected so as to resonate with each other at the working frequency. This creates a high impedance that limits current flow from the first trace segment 104A to the second trace segment 104B. Hence, no current or the small current Ismail flows through the conductive trace 104. Limiting current flow prevents the RF coil from coupling with other RF coils (e.g., other RF coils used as Rx coils in MRI).

Because of the parallel arrangement between the circuit branch 107 and the first reactive element 106, and because of the circuit branch 107 and the first reactive element 106 resonate at the working frequency, a reactance $X_{cb}$ of the circuit branch 107 and a reactance $X_1$ of the first reactive element 106 sum to zero at the working frequency. Hence, $X_{cb}$ is equal to $-X_1$ at the working frequency. Further, because the circuit branch 107 and the first reactive element 106 have no meaningful resistance, an impedance $Z_{cb}$ of the circuit branch 107 and an impedance $Z_1$ of the first reactive element 106 sum to zero at the working frequency. Hence, $Z_{cb}$ is equal to $-Z_1$ at the working frequency.

In view of the foregoing, impedance goes to infinity when calculating a total impedance $Z_{tot}$ for a parallel combination of the circuit branch 107 and the first reactive element 106.

$$Z_{tot} = \frac{1}{\frac{1}{Z_{cb}} + \frac{1}{Z_1}} = \frac{1}{\frac{1}{Z_{cb}} - \frac{1}{Z_{cb}}} = \frac{1}{0}$$

In practice, this translates to a high impedance because the resistive component of the impedance $Z_{cb}$ (e.g., the resistive loss of the circuit branch 107) is not zero. Such a high impedance may, for example, be greater than 1 kiloohm, 2 kiloohms, or more.

In some embodiments, the first reactive element 106 is an inductor with an inductance of about 47 nH, the second reactive element 109 is a capacitor with a capacitance of about 17.82 pF, the third reactive element 110 is an inductor with an inductance of about 94 nH, and the electrical element 114 is an inductor with an inductance of about 47 nH. In some of such embodiments, the high impedance may, for example, be about 1.8 kiloohms at a resonant frequency of 123 megahertz. Other suitable values are, however, amenable.

Figure 3:
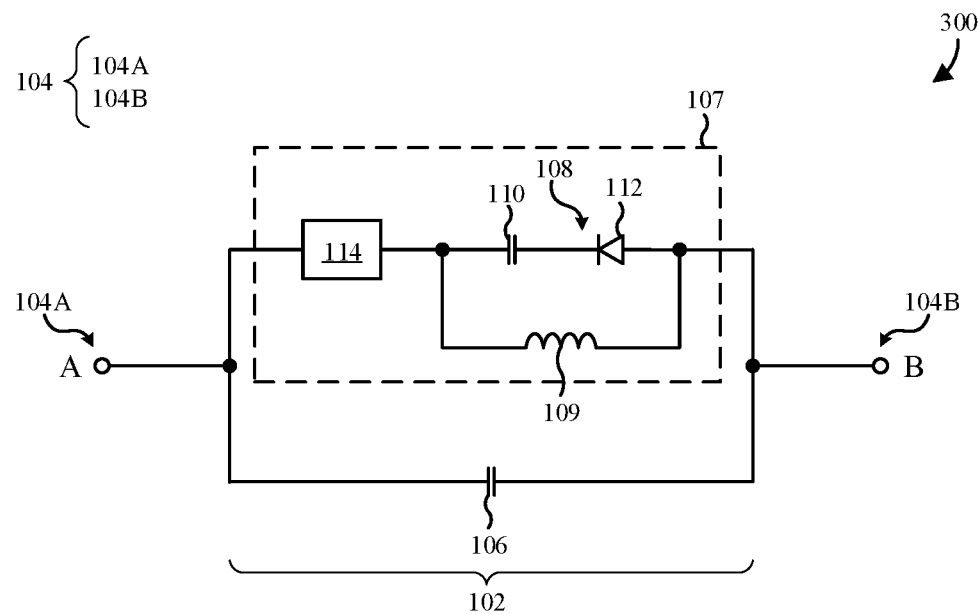
FIG. 3 is a circuit diagram illustrating a second embodiment of a current-control circuit for reducing PIN diode current in an RF coil.

FIG. 3 illustrates some embodiments of a circuit diagram 300 including a second embodiment of a circuit branch 107 for reducing PIN diode current in an RF coil (e.g., an MRI RF coil). FIG. 3 contains similarities to FIG. 1 but varies in that the first reactive element 106 and the third reactive element 110 are illustrated as capacitive elements (e.g., capacitors), and the second reactive element 109 is illustrated as an inductive element (e.g., inductors).

As above, the electrical element 114 may, for example, be an electrical short or a fourth reactive element. The fourth reactive element may, for example, be an inductive element (e.g., an inductor) or a capacitive element (e.g., a capacitor). However, practically, the electrical element 114 is the fourth reactive element and is of a same reactivity type (e.g., inductive or capacitive) as the third reactive element 110. For example, the electrical element 114 may be a capacitor in the illustrated case. Otherwise, there may be no reduction in current through the PIN diode 112 as explained hereafter with regard to FIGS. 6A-6C.

When the PIN diode 112 is ON, and hence the second reactive element 109 and the third reactive element 110 are electrically coupled in parallel, the second reactive element 109 and the third reactive element 110 are configured to resonate at a working frequency. For the illustrated case in which the second reactive element 109 is an inductor and the third reactive element 110 is an capacitor, such resonance may, for example, be achieved when a capacitance of the third reactive element 110 and an inductance of the second reactive element 109 are selected so as satisfy $$f = \frac{1}{2\pi\sqrt{LC}},$$

where f is the working frequency, L is the inductance, and C is the capacitance. As above, this creates a high impedance to reduce current through the PIN diode 112 in Tx mode.

When the PIN diode 112 is OFF, and hence the first reactive element 106 is electrically coupled in parallel with a series combination of the electrical element 114 and the second reactive element 109, the first reactive element 106 and the second reactive element 109, as well as the electrical element 114 when reactive, are configured to resonate at the working frequency. As above, the resonance creates a high impedance that blocks current in the RF coil in Rx mode. This prevents the RF coil from interfering with the receipt of RF signals by the other RF coils.

To the extent that the electrical element 114 is an electrical short, the first reactive element 106 and the second reactive element 109 are configured to resonate with each other at the working frequency to achieve coil decoupling in Rx mode. For example, the second reactive element 109 is an inductor, the first reactive element 106 is a capacitor, and the electrical element 114 is a short. In practice, no PIN diode current reduction may be achieved in Tx mode in this scenario. However, it is considered for theoretical purposes.

To the extent that the electrical element 114 is inductive, the electrical element 114 is further configured to resonate with the first reactive element 106 and the second reactive element 109 to achieve coil decoupling in Rx mode. For example, the second reactive element 109 is an inductor, the first reactive element 106 is a capacitor, and the electrical element 114 is an inductor. In practice, no PIN diode current reduction may be achieved in Tx mode in this scenario. However, it is considered for theoretical purposes.

To the extent that the electrical element 114 is capacitive, the electrical element 114 is further configured to resonate with the first reactive element 106 and the second reactive element 109 to achieve coil decoupling in Rx mode. For example, assume the electrical element 114 is a capacitor and further assume the second reactive element 109 is an inductor as illustrated and the first reactive element 106 is a capacitor as illustrated. This scenario is advantageous, since coil decoupling is achieved in Rx mode and PIN diode reduction is achieved in Tx mode.

In some embodiments, the first reactive element 106 is a capacitor with a capacitance of about 35.6 pF, the second reactive element 109 is an inductor with an inductance of about 94 nH, and the third reactive element 110 is a capacitor with a capacitance of about 17.821 pF. In some of such embodiments, the electrical element 114 is a capacitor with a capacitance of about 35.6 pF. For similar reasons as described with regard to FIGS. 2A and 2B, the 2:1 ratio between the capacitance of the third reactive element 110 and the capacitance of the first reactive element 106 results in a current reduction of approximately 50% through the PIN diode 112.

Figure 4A:
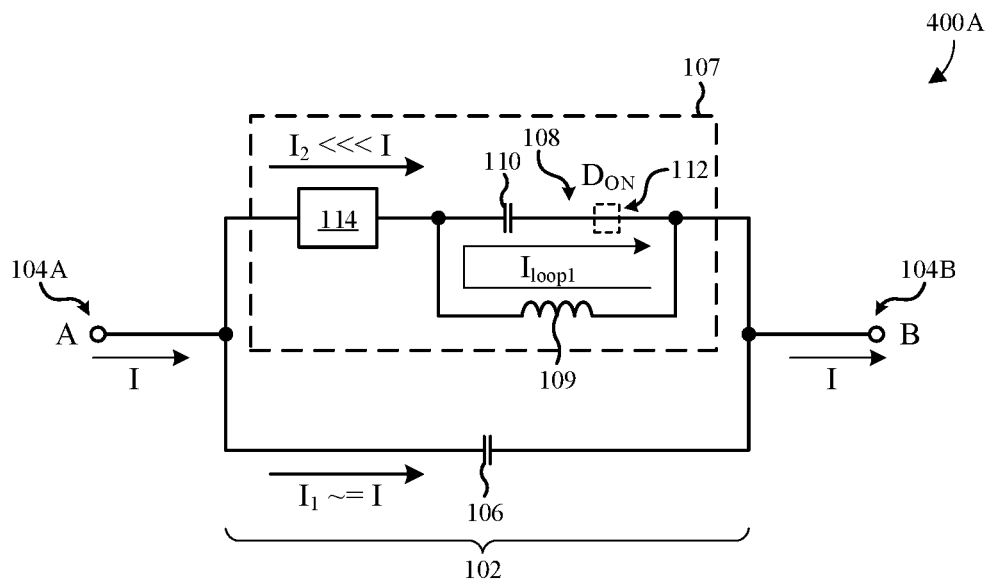
FIGS. 4A and 4B are circuit diagrams illustrating operation of the current-control circuit of FIG. 3 when the PIN diode is ON and OFF respectively.
Figure 4B:
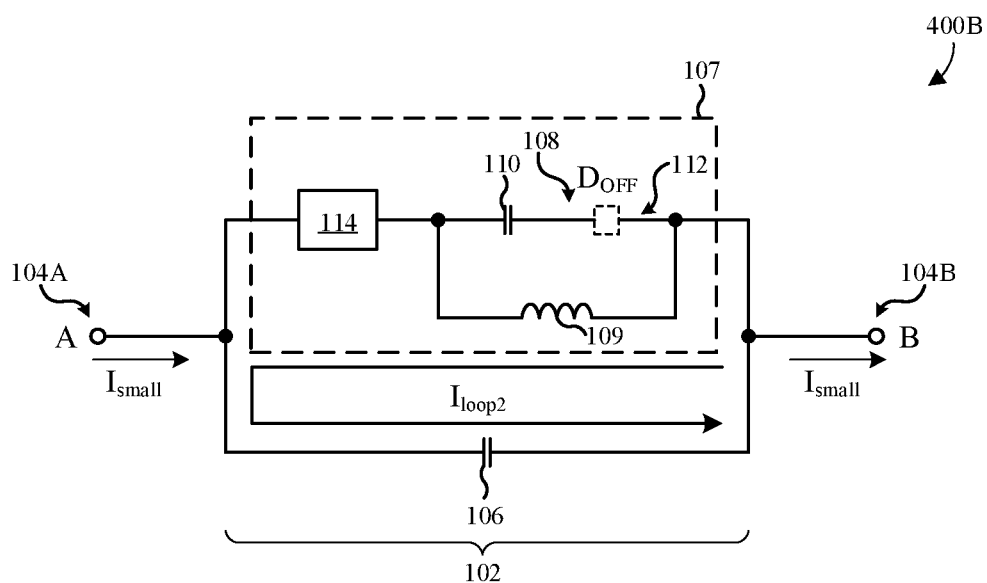

FIGS. 4A and 4B illustrate the operation 400A, 400B of the circuit diagram 300 of FIG. 3 when the PIN diode 112 is ON and OFF respectively. In FIG. 4A, the RF coil is in Tx mode and the PIN diode 112 is switched ON. As a result, the second and third reactive elements 109, 110 are electrically coupled in parallel and resonate to create a high impedance. Further, almost all current flows through the first reactive element 106 and current through the PIN diode 112 is reduced. Such operation is similar to that of FIG. 2A. In FIG. 4B, the RF coil is in Rx mode and the PIN diode 112 is switched OFF. As a result, the first reactive element 106 is electrically coupled in parallel with and resonates with a series combination of the electrical element 114 and the second reactive element 109 to create a high impedance.

Further, little to no current flows through the RF coil. Such operation is similar to that of FIG. 2B.

As seen in FIG. 1 to FIG. 4B, two approaches are illustrated for current reduction. FIGS. 1, 2A, and 2B illustrate approach 1, whereas FIGS. 3, 4A, and 4B illustrate approach 2. A benefit of approach 1 is that the first reactive element 106 may be part of the conductive trace 104 and may hence to Tx efficiency. A benefit of both approaches is that the electrical element 114, the second reactive element 109, and the third reactive element 110 may all be discrete devices (e.g., lumped elements). As such, values of these elements may be readily adjusted for different current reduction ratios. A benefit of approach 2 is that the first reactive element 106 is capacitive, and the first reactive element 106, the second reactive element 109, the third reactive element 110, and the electrical element 114 may all be discrete devices (e.g., lumped devices). As a result, the whole circuit can be designed in such a way that the Rx resonance leakage can be very small so that the circuit is very unlikely to couple to other Rx coils in Rx mode.

Figure 5:
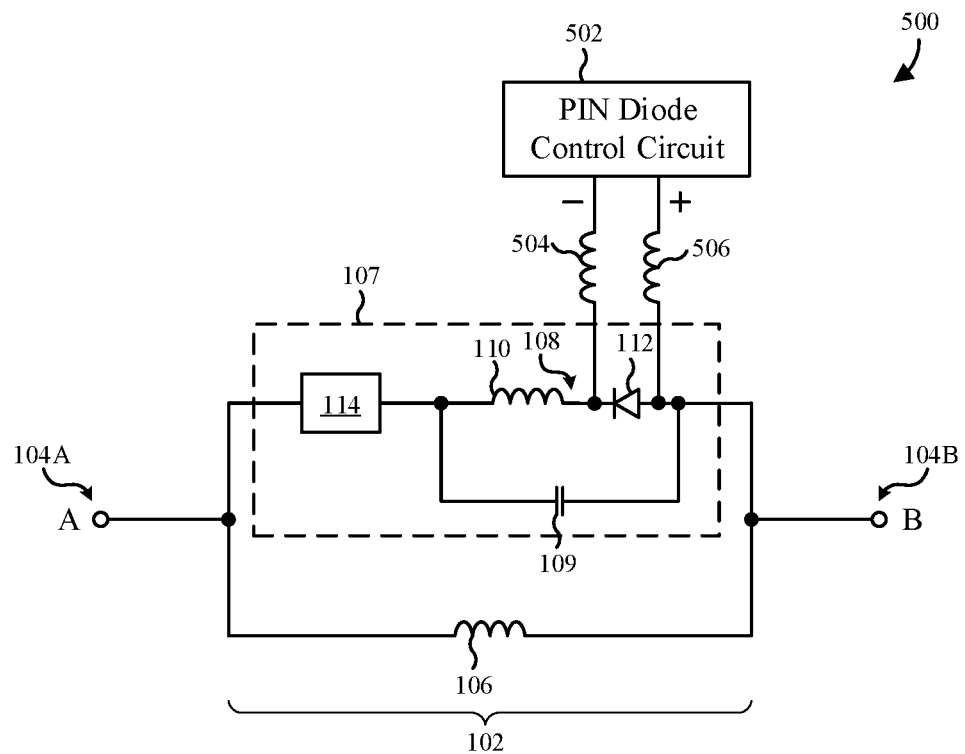
FIG. 5 is a circuit diagram illustrating a current-control circuit and a PIN diode control circuit in accordance with some aspects of the present disclosure.

FIG. 5 illustrates some embodiments of a circuit diagram 500 which resembles the circuit diagram 100 of FIG. 1, further including a PIN diode control circuit 502. The PIN diode control circuit 502 is electrically coupled across the PIN diode 112 via a first RF choke 504 and a second RF choke 506. The first and second RF chokes 504, 506 block RF signals while allowing direct current (DC) signals to pass and may, for example, be inductors or the like. The PIN diode control circuit 502 is configured to turn the PIN diode ON and OFF by selectively applying a DC bias across the PIN diode 112. Although the PIN diode control circuit 502 and the first and second RF chokes 504, 506 are applied to the circuit diagram 100 of FIG. 1, the PIN diode control circuit 502 may also be applied to other circuits utilizing PIN diodes throughout the present disclosure, such as, for example, the circuit diagram 300 of FIG. 3.

Figure 6A:
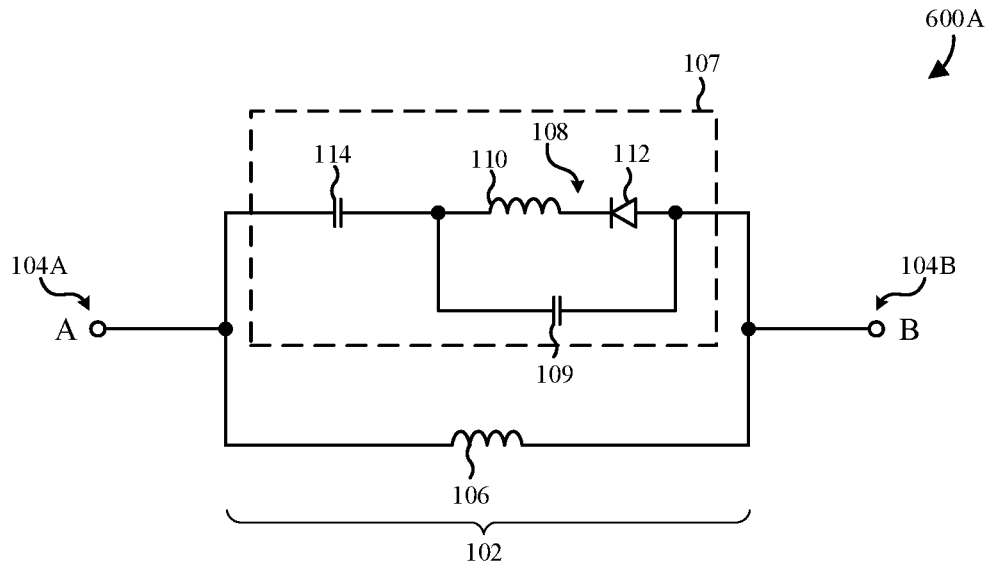
FIGS. 6A-6C are circuit diagrams illustrating a current-control circuit in which an electrical element is a capacitor, an inductor, and an electrical short respectively.
Figure 6B:
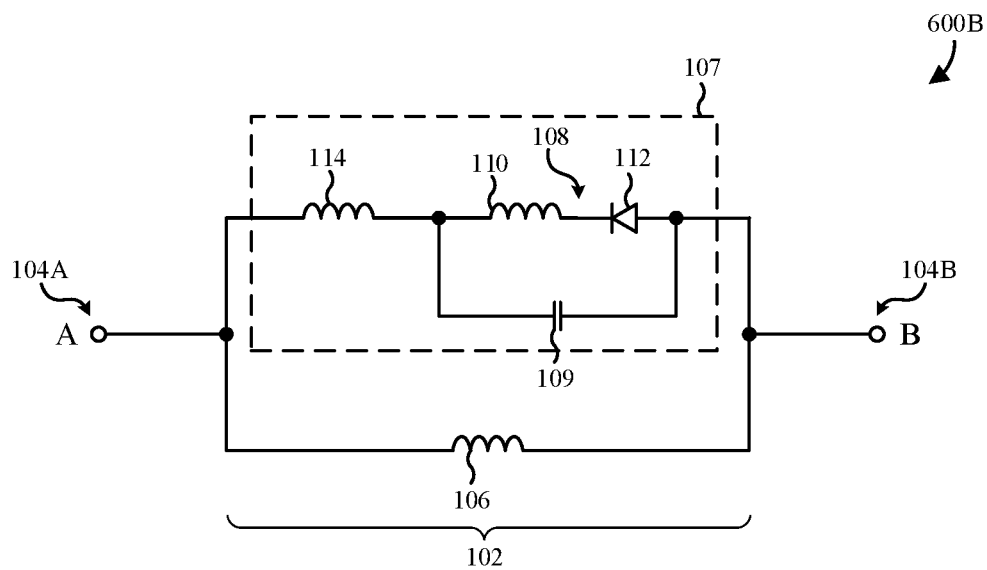
Figure 6C:
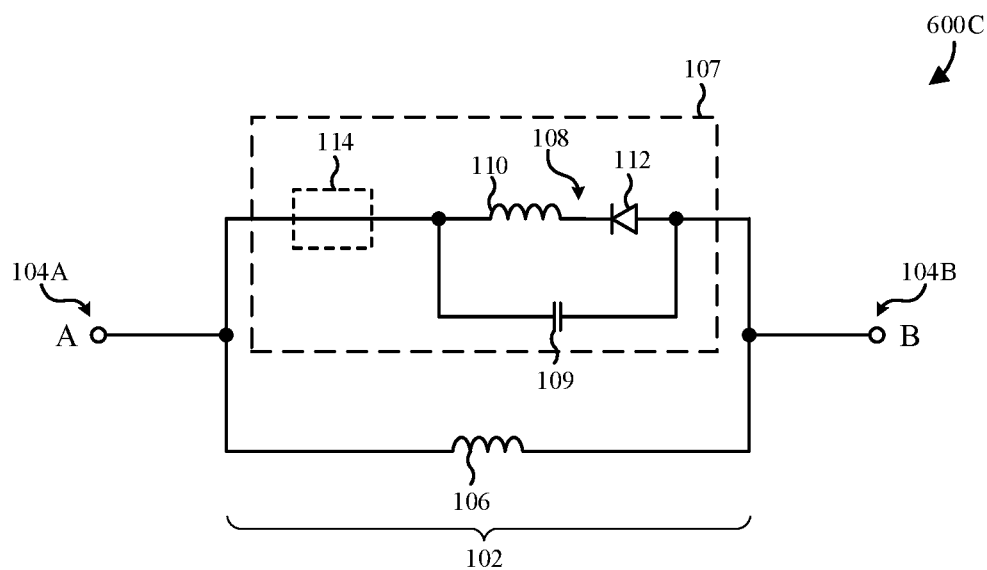

As described above, in some embodiments, the electrical element 114 is inductive or capacitive. FIG. 6A illustrates some embodiments of a circuit diagram 600A which resembles the circuit diagram 100 of FIG. 1, where the electrical element 114 is inductive. FIG. 6B illustrates some embodiments of a circuit diagram 600B which resembles the circuit diagram 100 of FIG. 1, where the electrical element 114 is capacitive. In alternative embodiments, the electrical element 114 is an electrical short. FIG. 6C illustrates some embodiments of a circuit diagram 600C which resembles the circuit diagram 100 of FIG. 1, where the electrical element 114 is an electrical short.

As previously described with reference to FIG. 1, the portion of current that flows through the PIN diode 112 is proportional to the ratio of $L_1/L_2$, where $L_1$ is the inductance of the first reactive element 106 and $L_2$ is the inductance of the third reactive element 110. The values of the first reactive element 106, the second reactive element 109, the third reactive element 110, and the electrical element 114 (when reactive) are selected such that resonance is achieved at the working frequency in both Tx and Rx modes. In practice, as shown in FIG. 6A, using a capacitor as the electrical element 114 may be undesirable for combined Tx/Rx mode performance.

In Tx mode, the PIN diode is ON. The third reactive element 110 resonates with the second reactive element 109 at the working frequency and the equation $$f = \frac{1}{2\pi\sqrt{LC}}$$

is satisfied, where $L=L_2$ and C is the capacitance of the second reactive element 109. In Rx mode the PIN diode is OFF and the series combination of the second reactive element 109 and the electrical element 114 resonate with the first reactive element 106 at the working frequency. The sum capacitance of the second reactive element 109 and the electrical element 114 is smaller than the capacitance of the second reactive element 109 alone, since capacitance decreases in series. In order for the equation $$f = \frac{1}{2\pi\sqrt{LC}}$$

to also be satisfied in the Rx mode (where $L=L_1$ and C is the series combination capacitance), $L_1$ is greater than $L_2$ (e.g., L increases as C decreases). Thus, the ratio $$\frac{L_1}{L_2}$$

is greater than 1, and the PIN diode current is actually an increased value.

Conversely, using a similar process, it may be calculated that the PIN diode 114 current decreases when the electrical element 114 is an inductor (e.g., as in FIG. 6B), which is desirable in order to achieve increased PIN diode lifetime while maintaining Rx performance. Similarly, a ratio of $$\frac{L_1}{L_2}$$

can be calculated as 1 (e.g., no PIN diode current increase or reduction) when the electrical element 114 is an electrical short, as illustrated in FIG. 6C.

While FIGS. 6A-6C apply variations of the electrical element 114 to the circuit diagram 100 of FIG. 1, the variations and methodologies/reasoning provide above can also be applied to other circuit diagrams described throughout the present disclosure. For example, the variations of the electrical element 114 and the corresponding analysis described with reference to FIGS. 6A-6C can also be applied to the circuit diagram of FIG. 3.

Figure 7:
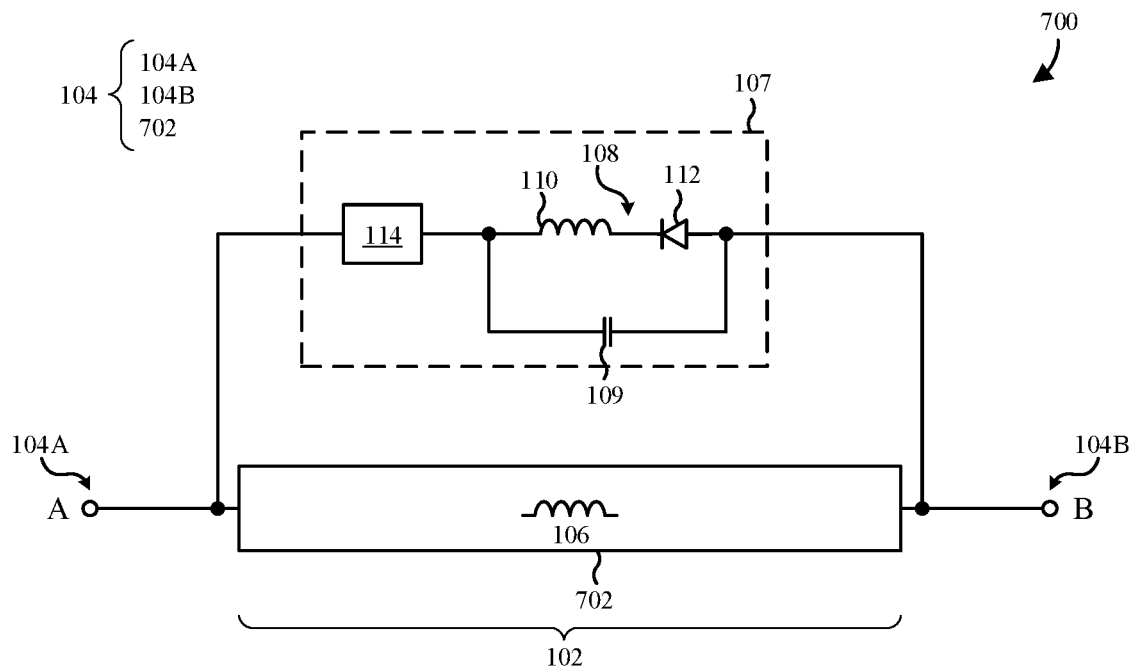
FIG. 7 is a schematic diagram illustrating a current-control circuit comprising a conductive trace segment.

FIG. 7 illustrates some embodiments of a schematic circuit diagram 700 which resembles the circuit diagram 100 of FIG. 1, where the conductive trace 104 further comprises a third trace segment 702 extending from the first trace segment 104A to the second trace segment 104B. The third trace segment 702 has an inductance and forms the first reactive element 106. As noted above, in some embodiments, the conductive trace 104 is or comprises one or more strips of copper or the like printed or otherwise adhered to a dielectric substrate.

Figure 8A:
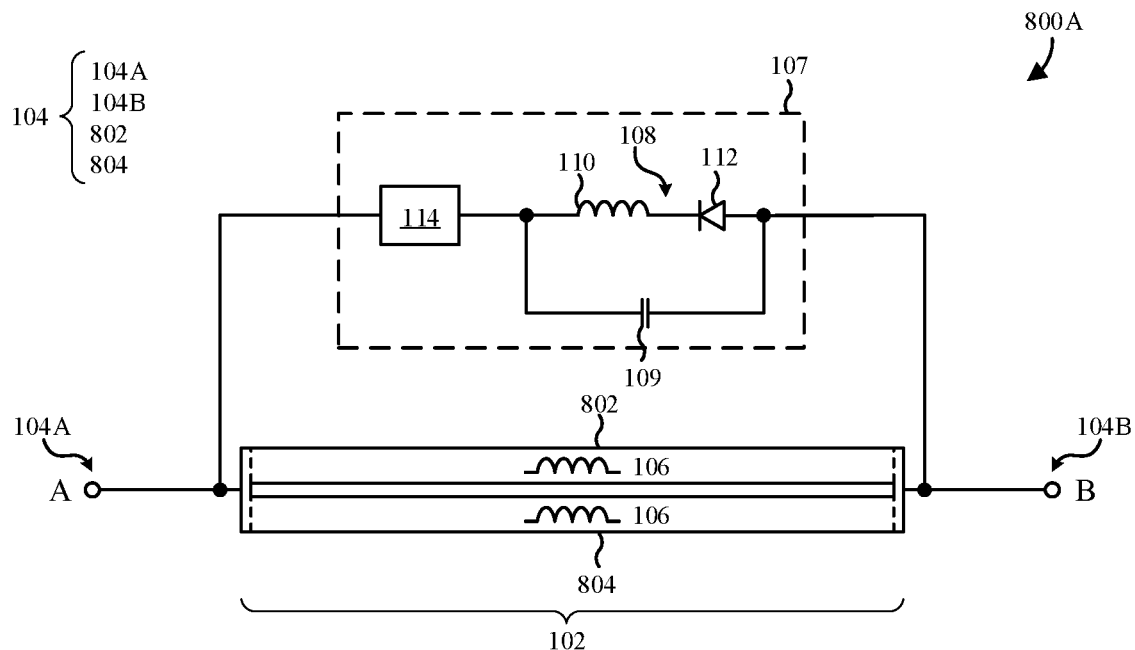
FIGS. 8A-8E are schematic diagrams illustrating a current-control circuit comprising conductive trace segments in accordance with various aspects of the present disclosure.

FIG. 8A illustrates some embodiments of a schematic circuit diagram 800A which resembles the circuit diagram 100 of FIG. 1, where the conductive trace 104 further comprises a third trace segment 802 and a fourth trace segment 804 electrically coupled in parallel with the third trace segment 802. The third trace segment 802 and the fourth trace segment 804 extend from the first trace segment 104A to the second trace segment 104B and are separated from each other by a gap. Further, the third trace segment 802 and the fourth trace segment 804 have individual inductances that combine in parallel to form the first reactive element 106.

Figure 8B:
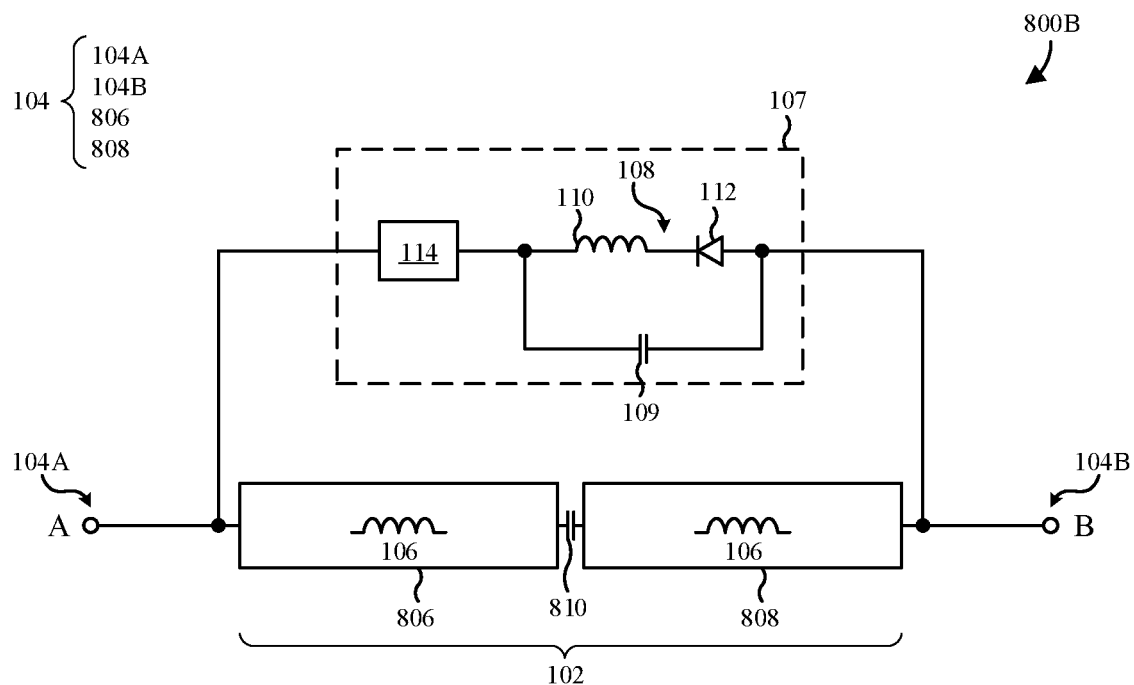

FIG. 8B illustrates some embodiments of a schematic circuit diagram 800B which resembles the circuit diagram 100 of FIG. 1, where the conductive trace 104 further comprises a third trace segment 806 and a fourth trace segment 808. The third trace segment 806 and the fourth trace segment 808 are electrically coupled in series with a capacitor 810 and are separated from each other by the capacitor 810. The capacitor 810 may, for example, function as a DC blocking capacitor during use of the RF coil. The series combination of the third trace segment 806, the capacitor 810, and the fourth trace segment 808 extends from the first trace segment 104A to the second trace segment 104B. Further, the third trace segment 806 and the fourth trace segment 808 have individual inductances that collectively form the first reactive element 106.

Figure 8C:
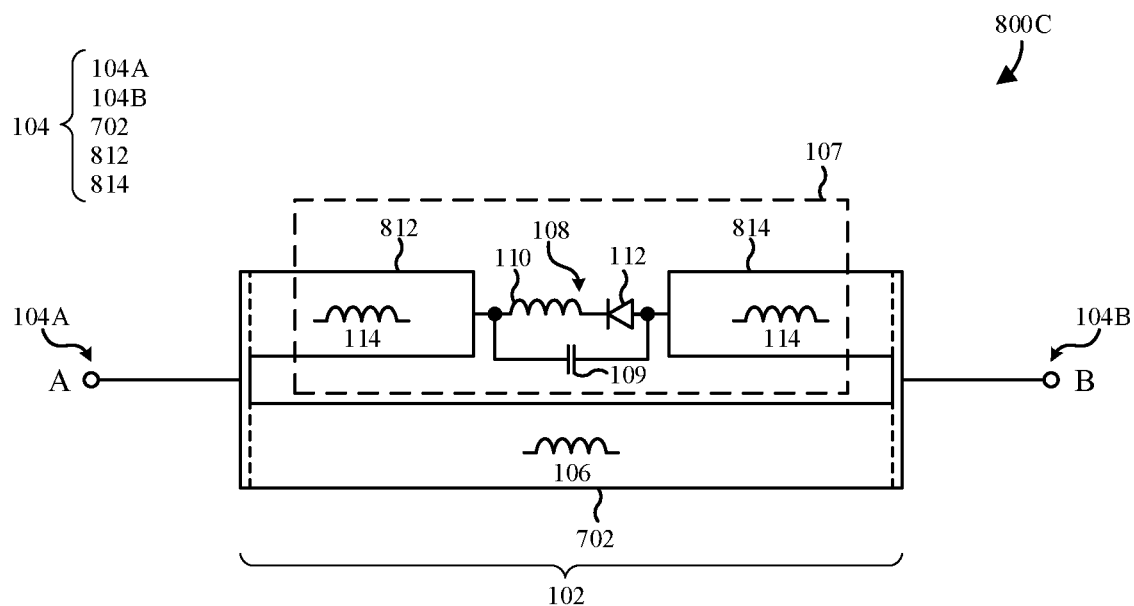

FIG. 8C illustrates some embodiments of a schematic circuit diagram 800C which resembles the schematic circuit diagram 700 of FIG. 7, where the conductive trace 104 further comprises a fifth trace segment 812 and a sixth trace segment 814. The fifth trace segment 812 and the sixth trace segment 814 are arranged in series with a parallel combination of the sub-circuit branch 108 and the second reactive element 109. Further, a series combination of the fifth trace segment 812, the sixth trace segment 814, and the parallel combination extends from the first trace segment 104A to the second trace segment 104B. The fifth trace segment 812 and the sixth trace segment 814 have individual inductances that collectively form the electrical element 114.

Figure 8D:
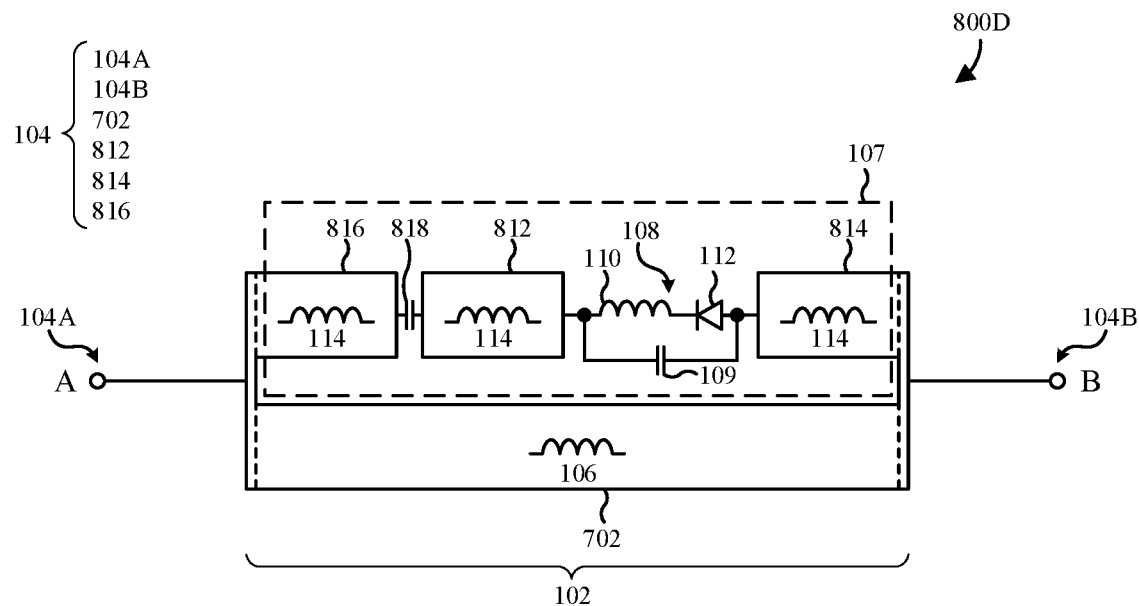

FIG. 8D illustrates some embodiments of a schematic circuit diagram 800D which resembles the schematic circuit diagram 800C of FIG. 8C, where the conductive trace 104 further comprises a seventh trace segment 816. The seventh trace segment 816 is arranged in series with the fifth trace segment 812 and is separated from the fifth trace segment 812 by a capacitor 818. The capacitor 818 may, for example, function as a DC blocking capacitor during use of the RF coil. A series combination of the fifth trace segment 812, the sixth trace segment 814, the seventh trace segment 816, the capacitor 818, and a parallel combination of the sub-circuit branch 108 and the second reactive element 109 extend from the first trace segment 104A to the second trace segment 104B. In some embodiments, the fifth trace segment 812, the sixth trace segment 814, and the seventh trace segment 816 individual inductances collectively forming the electrical element 114.

Figure 8E:
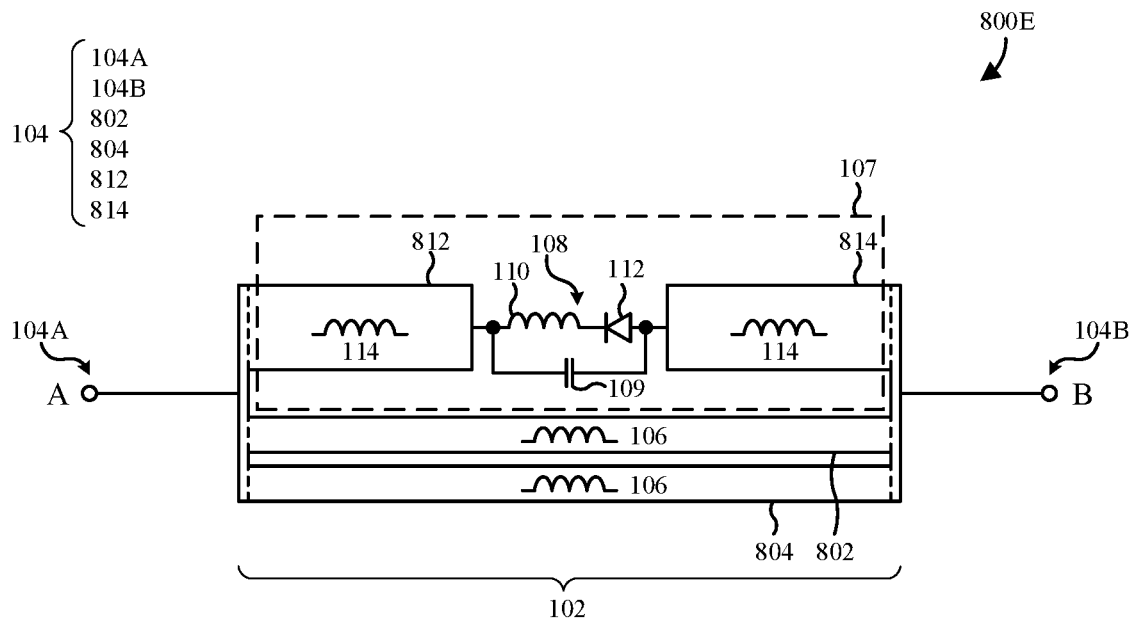

FIG. 8E illustrates some embodiments of a schematic circuit diagram 800E which resembles the circuit diagram 100 of FIG. 1, further comprising the third trace segment 802 of FIG. 8A, the fourth trace segment 804 of FIG. 8A, the fifth trace segment 812 of FIG. 8C, and the sixth trace segment 814 of FIG. 8C.

As described above, various reactive elements within the circuit may resonate depending on whether a coil is in Tx or Rx mode. During Rx mode, the resonance may cause the RF coil to couple to other RF coils due to a generated resonance $B_1$ field beyond a mechanical closure of the RF coil. In order to improve signal to noise ratio (SNR) in Rx mode, this coupling should be reduced when possible. One approach is to reduce the widths of trace segments and/or the gaps between trace segments. Other approaches are provided in FIGS. 9, 10A, and 10B.

Figure 9:
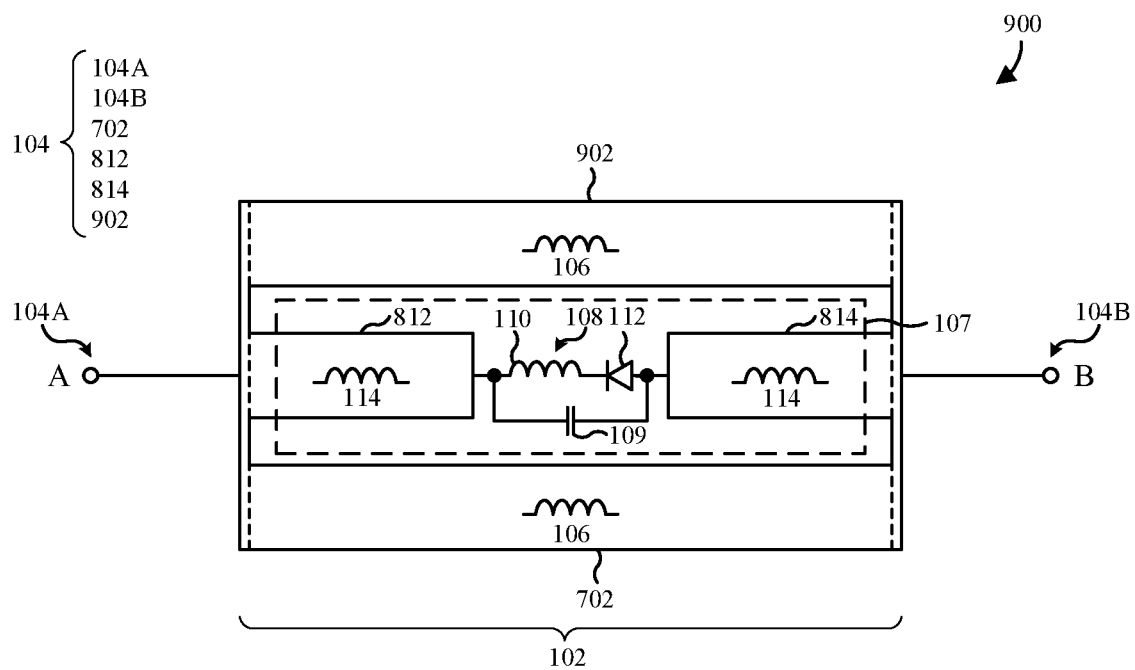
FIG. 9 to FIG. 10B are schematic diagrams illustrating a current-control circuit comprising conductive trace configurations for reducing resonance leakage in accordance with various aspects of the present disclosure.

FIG. 9 illustrates some embodiments of a schematic circuit diagram 900 which resembles the schematic circuit diagram 800C of FIG. 8C, further comprising a seventh trace segment 902. The seventh trace segment 902 is electrically coupled in parallel with the third trace segment 702 and the circuit branch 107. The third trace segment 702 and the seventh trace segment 902 have individual inductances collectively forming the first reactive element 106. The circuit branch 107 is between the third trace segment 702 and the seventh trace segment 902 to form a "saddle" structure which significantly improves $B_1$ field self-containment.

Figure 10A:
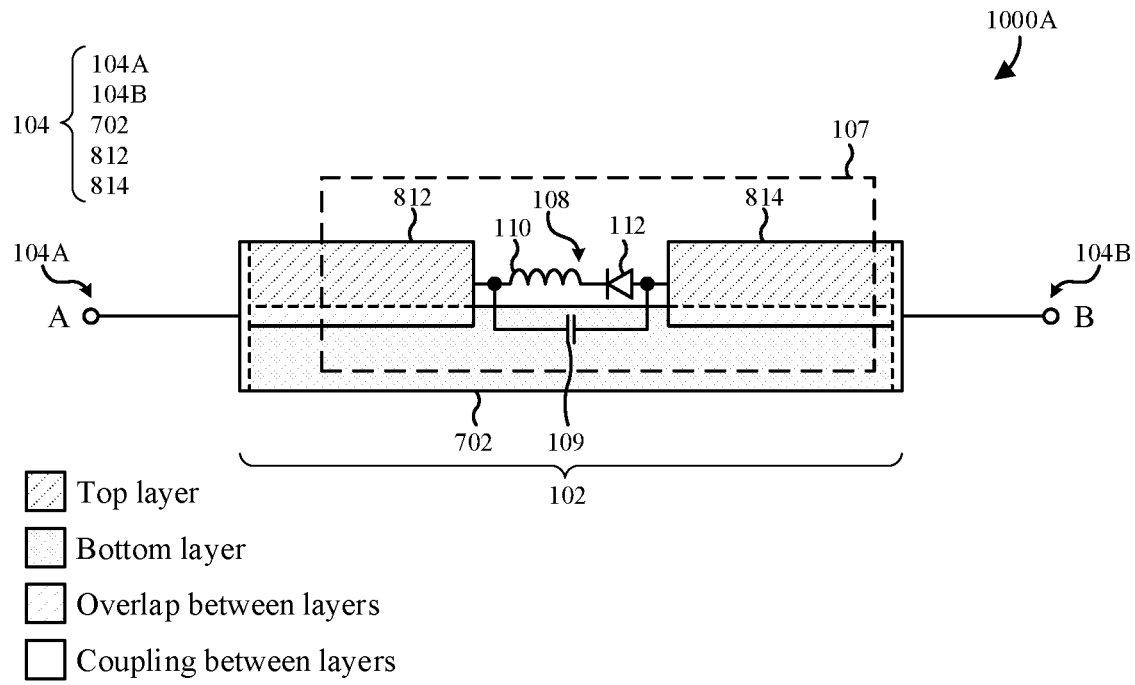
Figure 10B:
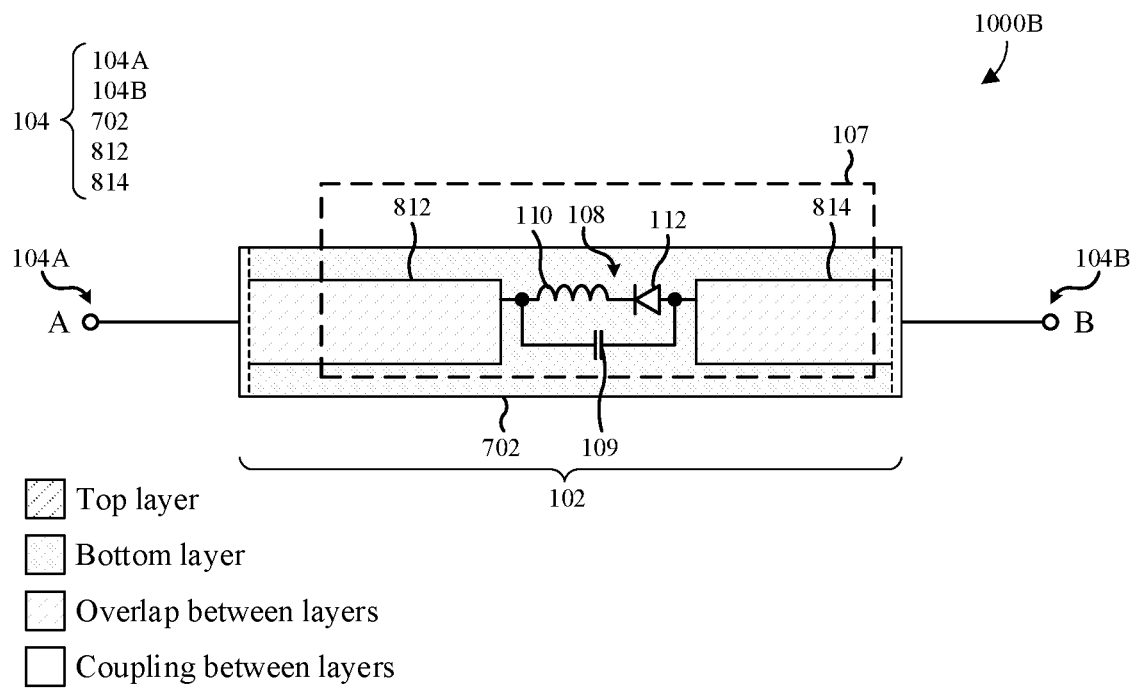

FIGS. 10A and 10B illustrate some embodiments of schematic circuit diagrams 1000A and 1000B which resemble the schematic circuit diagram 800C of FIG. 8C, where the fifth trace segment 812 and the sixth trace segment 814 overlap with the third trace segment 702. In FIG. 10A, the fifth trace segment 812 and the sixth trace segment 814 partially overlap with the third trace segment 702. In FIG. 10B, the fifth trace segment 812 and the sixth trace segment 814 completely overlap with the third trace segment 702. Overlapping the fifth and sixth trace segments 812, 814 with the third trace segment 702 reduces the equivalent width of the resonant loop, which consequently reduces $B_1$ field leakage and therefore improves Rx SNR.

Figure 11:
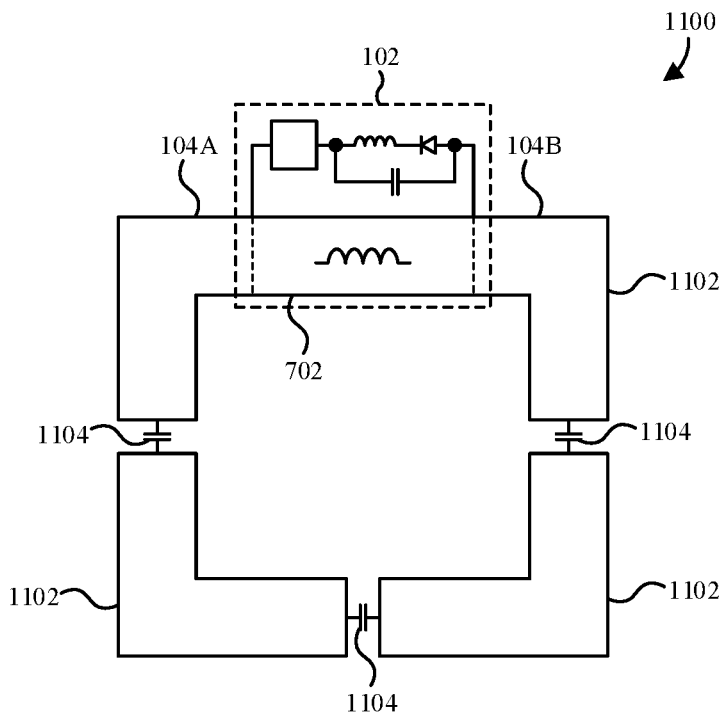
FIGS. 11 and 12 are schematic diagrams illustrating a coil element comprising different embodiments of a current-control circuit respectively.

FIG. 11 illustrates some embodiments of a coil element 1100 including the current-control circuit 102 (e.g., from FIG. 1 or FIG. 7). The coil element 1100 comprises a plurality of conductive traces 1102 arranged in a loop and interconnected by capacitors 1104. The capacitors 1104 may, for example, correspond to one or more of DC blocking capacitors, breaking point capacitors, and so on. The plurality of conductive traces 1102 comprise the first trace segment 104A and the second trace segment 104B as described with reference to FIG. 1. Further, the plurality of conductive traces 1102 comprise the third trace segment 702 described with reference to FIG. 7. As schematically illustrated, the third trace segment 702 corresponds to the first reactive element 106. The plurality of conductive traces 1102 may, for example, be or comprise one or more strips of copper or the like printed or otherwise adhered to a dielectric substrate.

As described above, the current-control circuit 102 is configured to control current flow through the plurality of conductive traces 1102 and through a PIN diode of the current-control circuit 102. In Rx mode, current flow in the coil element 1100 is blocked or otherwise minimized so the coil element does not interfere with other coil elements. In Tx mode, current flow is directed around the current-control circuit 102 so as to minimize current flow in the PIN diode.

Figure 12:
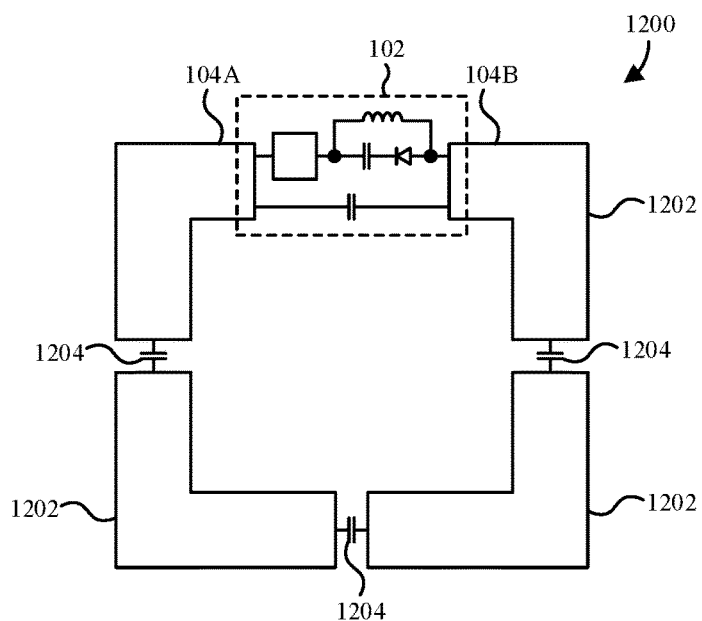

FIG. 12 illustrates some embodiments of a coil element 1200 including the current-control circuit 102 (e.g., from FIG. 3). The coil element 1200 comprises a plurality of conductive traces 1202 arranged in a loop and interconnected by capacitors 1204. The plurality of conductive traces 1202 comprise the first trace segment 104A and the second trace segment 104B as described with reference to FIG. 3. Further, the current-control circuit 102 extends from the first trace segment 104A to the second trace segment 104B. The plurality of conductive traces 1202 may, for example, be or comprise one or more strips of copper or the like printed or otherwise adhered to a dielectric substrate. The capacitors 1204 may, for example, correspond to one or more of DC blocking capacitors, breaking point capacitors, and so on.

Figure 13A:
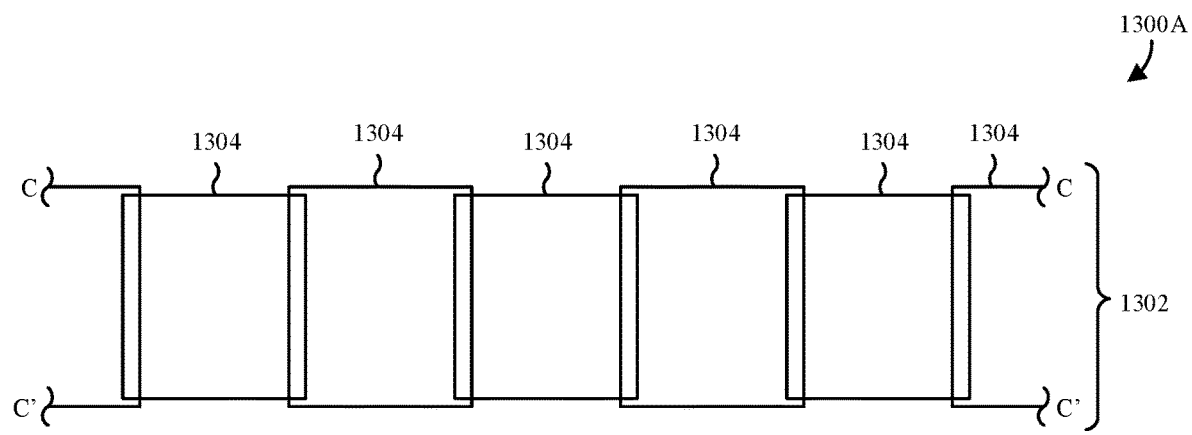
FIGS. 13A and 13B are schematic diagrams illustrating various views of a magnetic resonance imaging (MRI) RF coil comprising a plurality of coil elements as in FIG. 11 and/or FIG. 12.
Figure 13B:
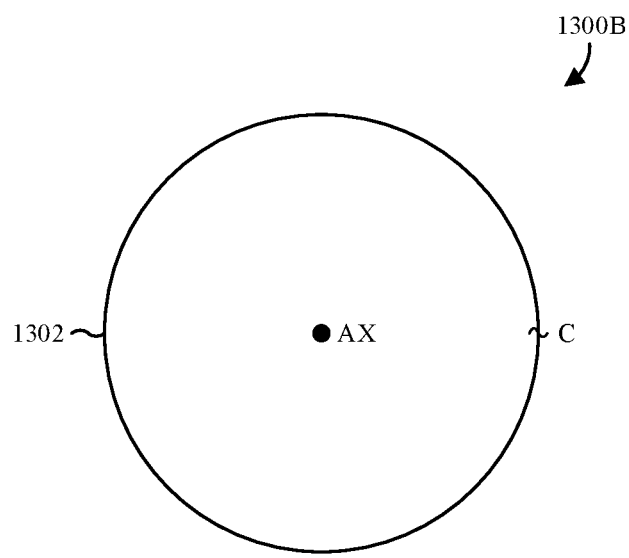

FIGS. 13A and 13B illustrate various views 1300A, 1300B of some embodiments of an MRI RF array coil 1302 comprising a plurality of coil elements 1304. FIG. 13A corresponds to a flattened schematic view of the MRI RF array coil 1302, whereas FIG. 13B corresponds to an axial schematic view of the MRI RF array coil 1302 in which the MRI RF array coil 1302 is arranged circumferentially around an axis AX. Further, for simplicity, the coil elements 1304 are shown as rectangles. Other suitable shapes are amenable in alternative embodiments. Each of the coil elements 1304 is as the coil element 1100 of FIG. 11 or the coil element 1200 of FIG. 12 is illustrated and described.

Figure 14A:
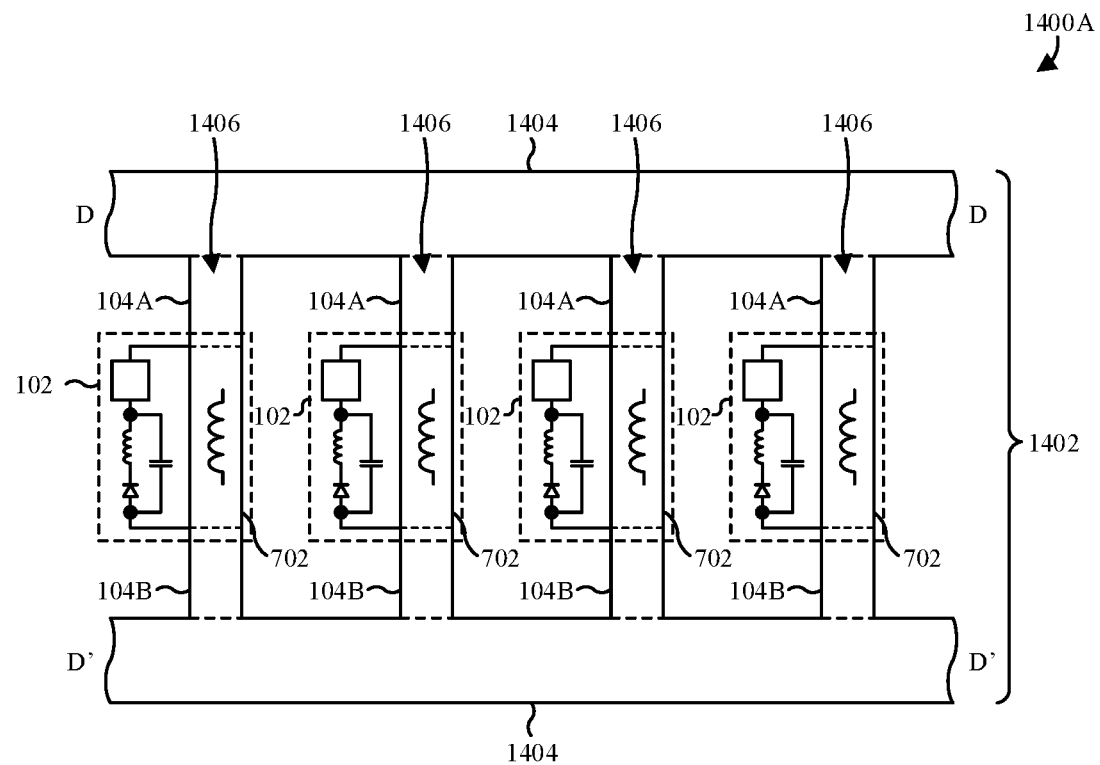
FIGS. 14A-14C are schematic diagrams illustrating first embodiments of a MRI RF birdcage coil comprising different embodiments of a current-control circuit respectively.
Figure 14B:
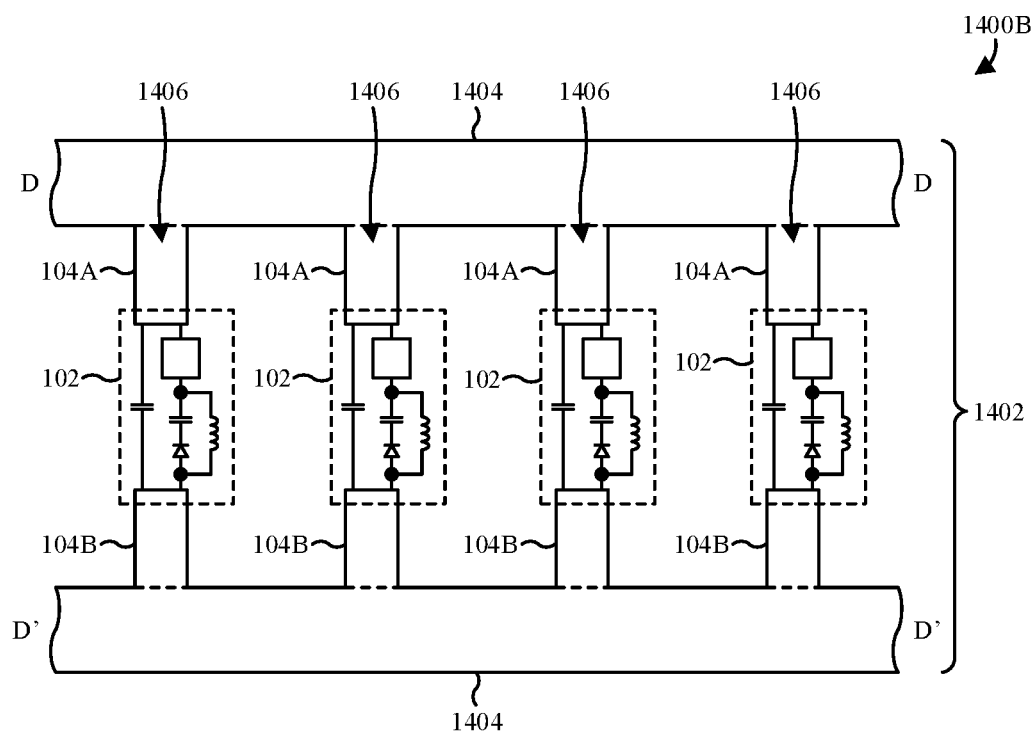
Figure 14C:
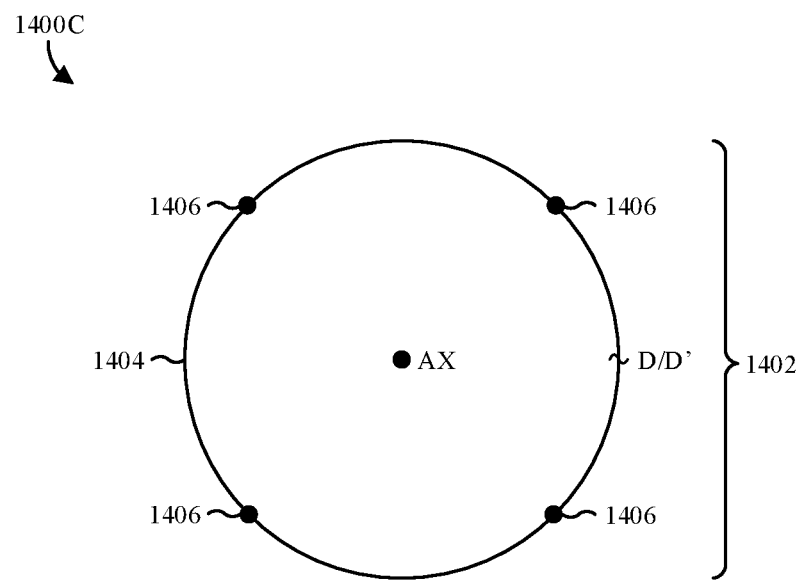

FIGS. 14A-14C illustrate various views 1400A, 1400B, 1400C of some embodiments of an MRI RF birdcage coil 1402. FIG. 14A corresponds to a flattened schematic view of the MRI RF birdcage coil 1402 including the current-control circuit 102, for example, from FIG. 1 or FIG. 7. FIG. 14B corresponds to a flattened schematic view of the MRI RF birdcage coil 1402 including the current-control circuit 102, for example, from FIG. 3. FIG. 14C corresponds to an axial schematic view of the MRI RF birdcage coil 1402 (as in FIG. 14A and/or FIG. 14B) in which the MRI RF birdcage coil 1402 is arranged circumferentially around an axis AX.

The MRI RF birdcage coil 1402 comprises a pair of end rings 1404 and a plurality of rungs 1406. The rungs 1406 are circumferentially arranged (e.g., evenly or unevenly arranged) along the end rings 1404, with each rung extending from one of the end rings 1404 to another one of the end rings 1404 along the axis AX. Further, each of the rungs 1406 is electrically coupled to a current-control circuit 102 as described with reference to the previous figures.

Figure 15A:
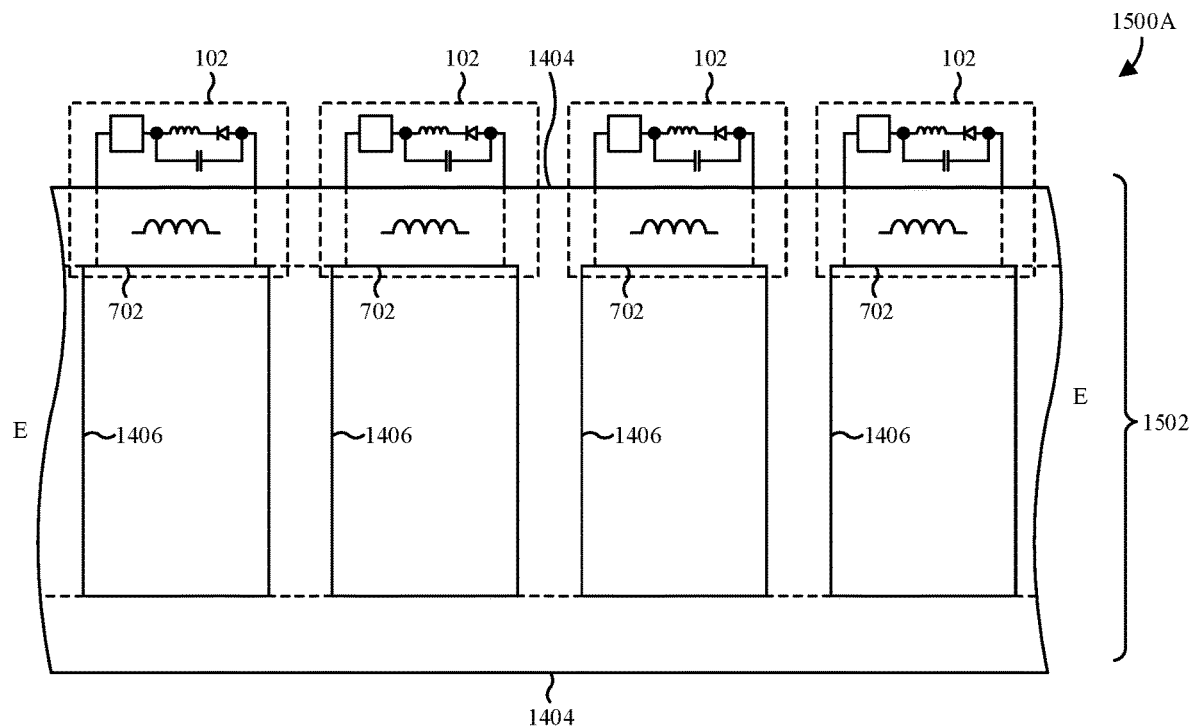
FIGS. 15A-15C are schematic diagrams illustrating second embodiments of a MRI RF birdcage coil comprising different embodiments of a current-control circuit respectively.
Figure 15B:
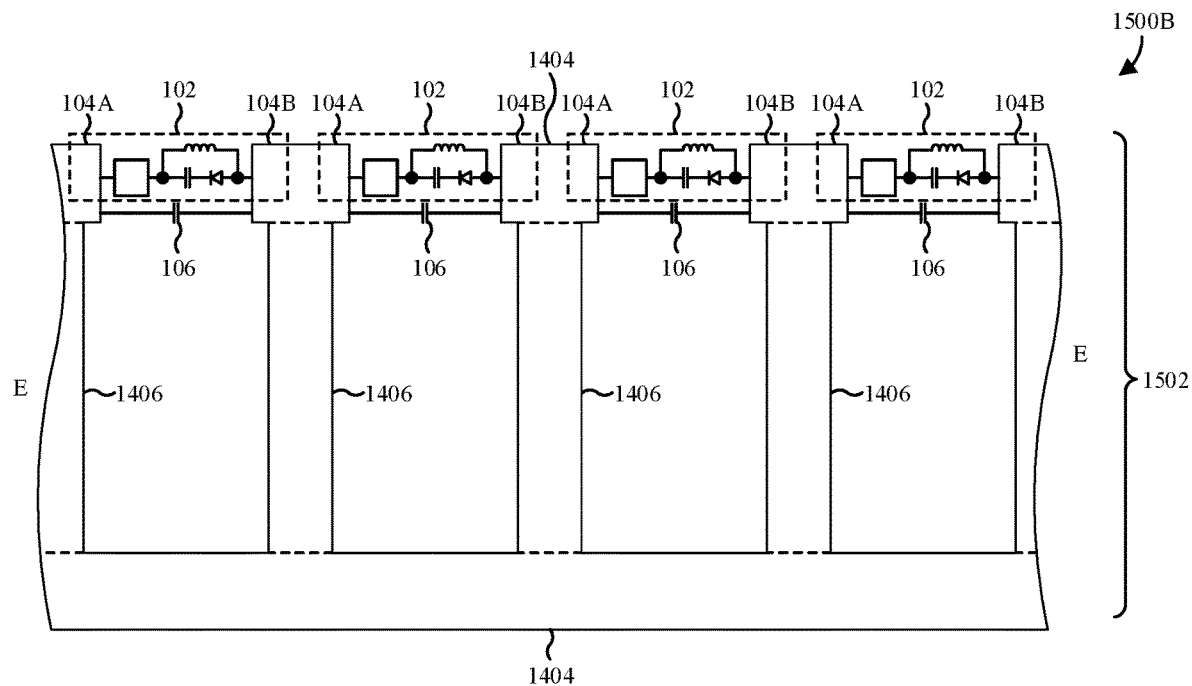
Figure 15C:
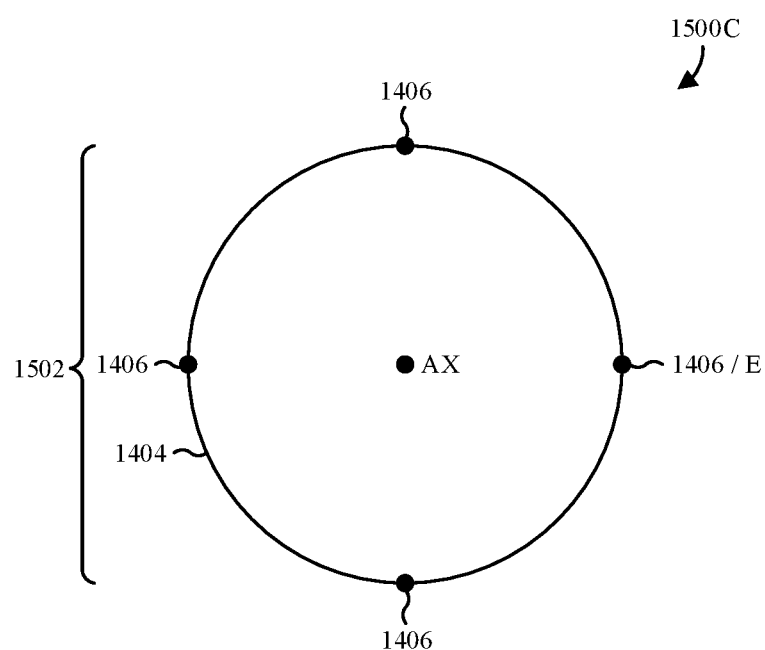

FIGS. 15A-15C illustrate various views 1500A, 1500B, 1500C of some embodiments of an MRI RF birdcage coil 1502. FIG. 15A corresponds to a flattened schematic view of the MRI RF birdcage coil 1502 including the current-control circuit 102, for example, from FIG. 1 or FIG. 7. FIG. 15B corresponds to a flattened schematic view of the MRI RF birdcage coil 1502 including the current-control circuit 102, for example, from FIG. 3. FIG. 15C corresponds to an axial schematic view of the MRI RF birdcage coil 1502 (as in FIG. 15A and/or FIG. 15B) in which the MRI RF birdcage coil 1502 is arranged circumferentially around an axis AX.

Similar to the MRI RF birdcage coil 1402, the MRI RF birdcage coil 1502 comprises a pair of end rings 1404 and a plurality of rungs 1406. However, in contrast to FIGS. 14A-14C, a current-control circuit 102 repeats at various points along one or both of the end rings 1404. For example, each pair of neighboring ring-rung joints along one of the end rings 1404 has a current-control circuit separating the ring-run joints of that pair.

As seen in FIG. 1 to FIG. 4B, two approaches are illustrated for current reduction. FIGS. 1, 2A, and 2B illustrate approach 1, whereas FIGS. 3, 4A, and 4B illustrate approach 2. If approach 2 is used for the current reduction with a birdcage coil (e.g., as in FIG. 14B or FIG. 15B), a capacitance of the first reactive element 106 is large enough so that it doesn't change the intended birdcage type. Birdcage types include high pass, low pass, and band pass. For example, supposing a high pass birdcage coil in which capacitors (excluding the first reactive element 106) are only on end rings, adding the current-control circuit 102 on rungs depends on the first reactive element 106 being large enough so that the high pass birdcage coil is still a high pass birdcage coil.

Figure 16:
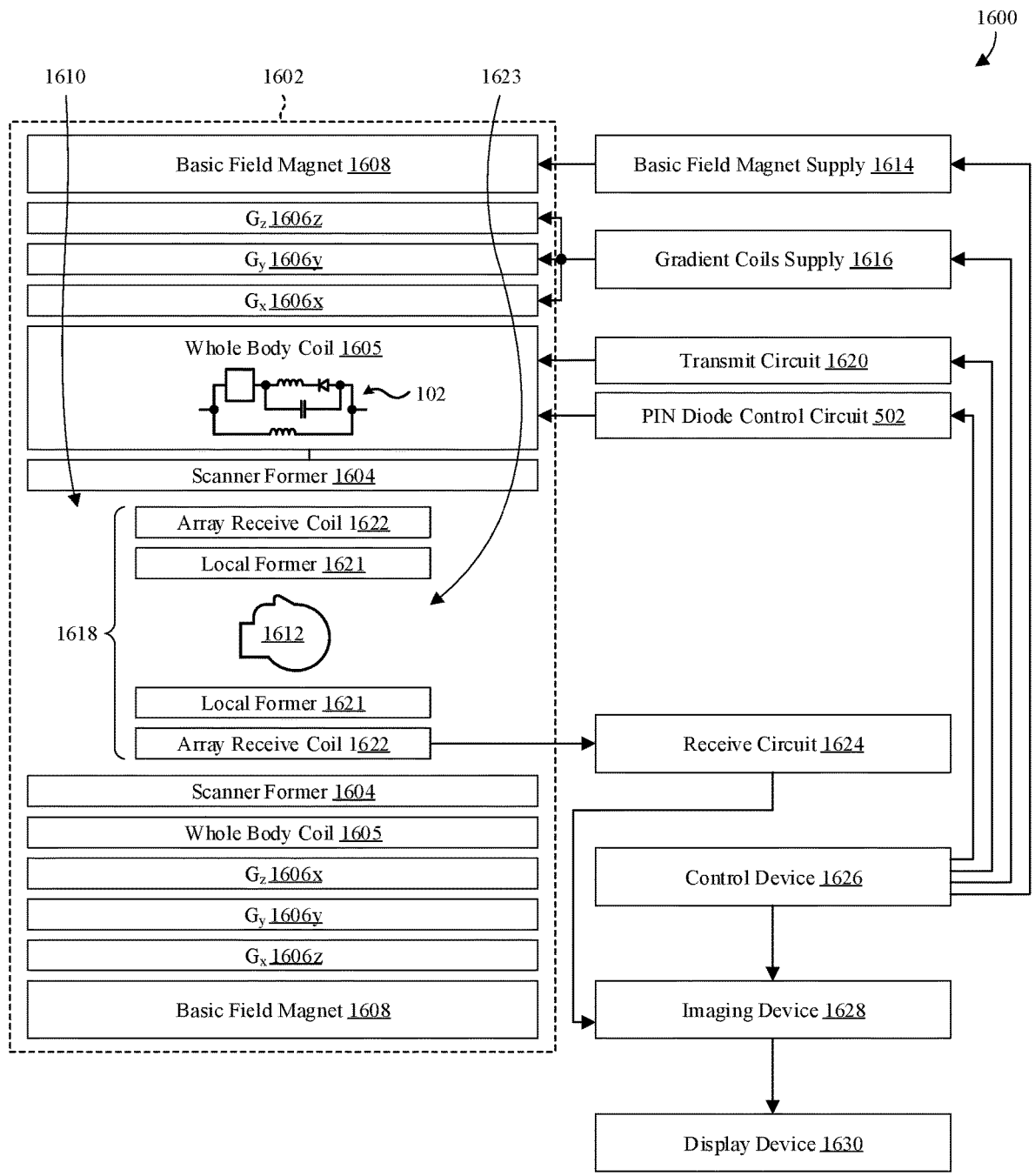
FIGS. 16 and 17 are block diagrams illustrating an MRI system in accordance with various aspects of the present disclosure.

FIG. 16 illustrates a block diagram 1600 of some embodiments of an MRI system in which a WBC 1605 including a current-control circuit 102 is employed. The MRI system is illustrated as a horizontal MRI system but may be a vertical MRI system in alternative embodiments. The WBC 1605 may, for example, be a birdcage coil or the like. The MRI system comprises a scanner 1602, and the scanner 1602 comprises a scanner former 1604, the WBC 1605, a plurality of gradient coils 1606x-1606z, and a basic field magnet 1608.

The scanner former 1604 surrounds a scanner bore 1610, which is sized to receive a scan target 1612 for MRI (e.g., a patient). Further, the scanner former 1604 is surrounded by the WBC 1605 (which includes the current-control circuit 102), the gradient coils 1606x-1606z, and the basic field magnet 1608. The scanner former 1604 provides rigidity to the surrounding structure and may, for example, be or be part of a housing of the scanner 1602. Further, the scanner former 1604 may, for example, have a shape that is cylindrical or the like.

The gradient coils 1606x-1606z surround the scanner former 1604, and the basic field magnet 1608 surrounds the gradient coils 1606x-1606z. The basic field magnet 1608 is electrically coupled to, and controlled in part by, a basic field magnet power supply 1614. The basic field magnet 1608 produces a $B_0$ magnetic field over the scan target 1612 in a Z direction. The Z direction may, for example, be left to right in FIG. 16.

The gradient coils 1606x-1606z emit gradient magnetic fields to spatially encode MRI signals received from the scan target 1612. The gradient coils 1606x-1606z include an x-direction gradient coil 1606x, a y-direction gradient coil 1606y, and a z-direction gradient coil 1606z for spatially encoding the MRI signals respectively in the X, Y, and Z directions. The Z direction is parallel to the $B_0$ magnetic field produced by the basic field magnet 1608, whereas the X and Y directions are transverse to the $B_0$ magnetic field. In alternative embodiments, one or more of the gradient coils 1606x-1606z is/are omitted. The gradient coils 1606x-1606z are electrically coupled to, and controlled in part, by a gradient coil power supply 1616.

The WBC 1605 surrounds the scanner former 1604 between then scanner former 1604 and the gradient coils 1606x-1606z. In some embodiments, the WBC 1605 is a birdcage coil as in FIGS. 14A and 14C, FIGS. 14B and 14C, FIGS. 15A and 15C, or FIGS. 15B and 15C. In other embodiments, the WBC 1605 is an array coil as in FIGS. 11, 13A, and 13B or as in FIGS. 12, 13A, and 13B. The WBC 1605 comprises the current-control circuit 102, which may, for example, be as in any one or combination of FIGS. 1, 2A, 2B, 3, 4A, 4B, 5, 6A-6C, 7, 8A-8E, 9, 10A, and 10B. The current-control circuit 102 may be used to control current through the WBC 1605 during Tx/Rx mode while reducing current through a PIN diode of the current-control circuit 102. Current-control operation may be achieved, for example, by selectively applying a DC bias to a PIN diode of the current-control circuit 102 via the PIN diode control circuit 502.

A transmit circuit 1620 is electrically coupled to the WBC 1605. The transmit circuit 1620 may be electrically coupled to the WBC 1605 by phase shifters, matching circuits, combiners, etc. The transmit circuit 1620 drives the WBC 1605 to generate a $B_1$ magnetic field transverse to the $B_0$ magnetic field when the MRI system operates in Tx mode. For example, the transmit circuit 1620 may drive the WBC 1605 to generate RF pulses at the Larmor frequency for hydrogen nuclei or some other suitable nuclei. As previously described, during the Tx mode, components within the current-control circuit 102 may resonate at the Larmor frequency to allow current to flow through the WBC 1605 while simultaneously minimizing PIN diode current. The $B_1$ magnetic field excites nuclei in the scan target 1612, which causes the nuclei to emit MRI signals. When the MRI system operates in a Rx mode, the WBC 1605 is disabled by the current-control circuit 102.

A local MRI RF coil 1618 is in the scanner bore 1610 and comprises a local former 1621 and an array receive coil 1622. The local former 1621 surrounds a local bore 1623, which is sized to receive an anatomical feature of the scan target 1612 for MRI. The anatomical feature may, for example, be a head, a knee, a wrist, a leg, a body, an arm, or some other suitable type of anatomical feature. Further, the local former 1621 is surrounded by the array receive coil 1622. The local former 1621 provides rigidity to the surrounding structure (e.g., the array receive coil 1622) and may, for example, be or be part of a housing of the local MRI RF coil 1618. Further, the local former 1621 may, for example, have a shape that is cylindrical or the like.

The array receive coil 1622 is electrically coupled to a receive circuit 1624. The local array receive coil 1622 may, for example, be a phased array receive coil or some other suitable type of coil. In the Rx mode of the MRI system, the receive circuit 1624 receives the MRI signals using the array receive coil 1622. As described above, these MRI signals are generated in response to excitation of nuclei by the WBC 1605 when the MRI system is in the Tx mode. In the Tx mode of the MRI system, the array receive coil 1622 is disabled and/or decoupled from the $B_1$ magnetic field to prevent damage to the receive circuit 1624. In the Rx mode of the MRI system, the WBC 1605 is disabled by the current-control circuit 102.

The basic field magnet power supply 1614, the gradient coil power supply 1616, the transmit circuit 1620, or any combination of the foregoing is/are controlled by a control device 1626. An imaging device 1628 receives MRI signals from the receive circuit 1624 and, in embodiments, receives control signals from the control device 1626. Based thereon, the imaging device 1628 generates an image of the scan target 1612 and outputs the image to a display device 1630. The imaging device 1628 generates the image by performing a transformation process on the MRI signals, such as, for example, a two-dimensional fast Fourier transform (FFT) or some other suitable transform. The control device 1626 may, for example, be a general-purpose device (e.g., a computer) executing instructions or an application-specific device. Similarly, the imaging device 1628 may, for example, be a general-purpose device (e.g., a computer) executing instructions or an application-specific device. While the control device 1626 and the imaging device 1628 are shown as being separate, the control device 1626 and the imaging device 1628 may be integrated together in alternative embodiments.

Figure 17:
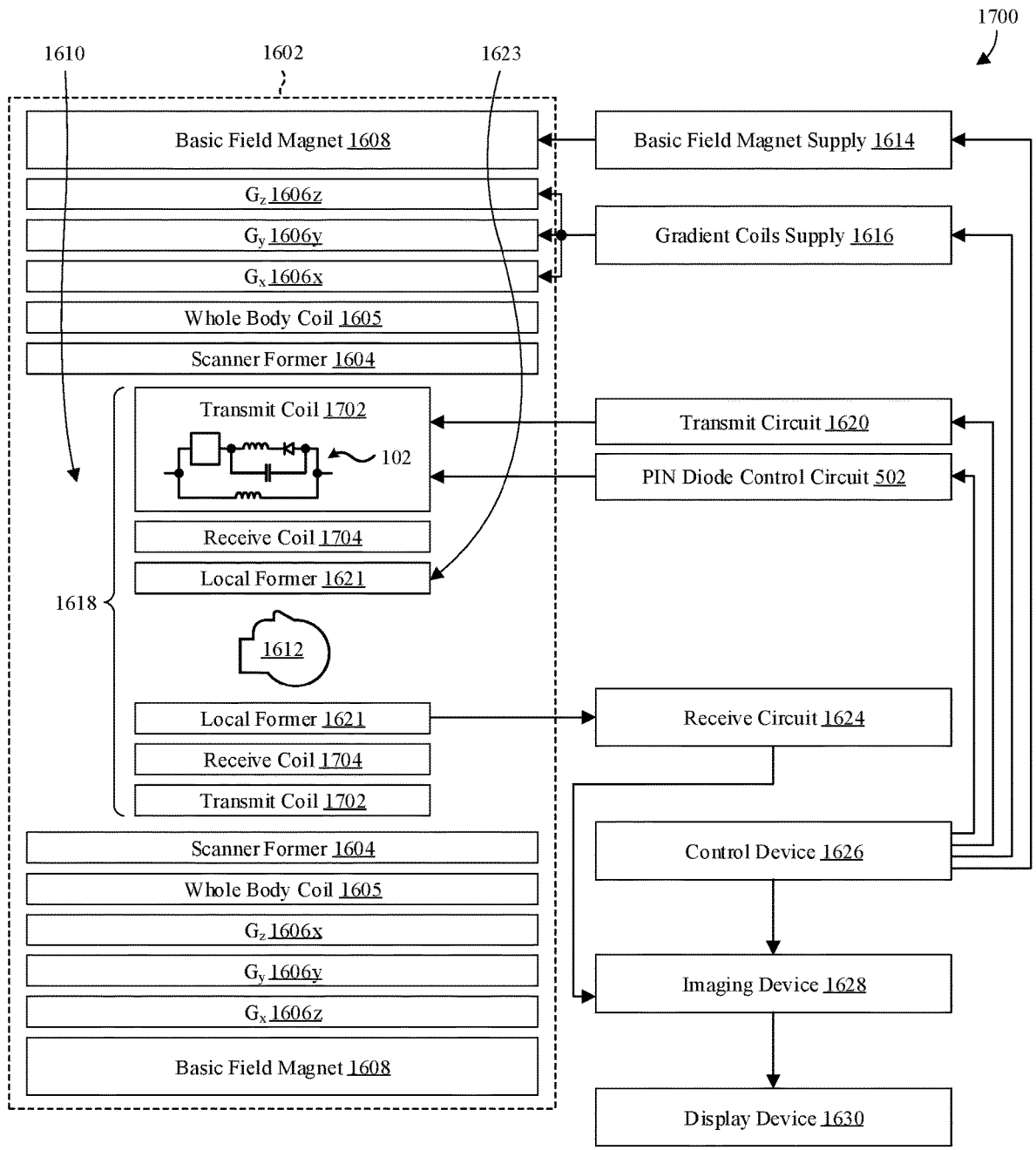

FIG. 17 illustrates a block diagram 1700 of some additional embodiments of an MRI system. The block diagram 1700 contains similarities to the block diagram 1600 of FIG. 16. However, the block diagram 1700 varies from the block diagram 1600 in that the current-control circuit 102 is implemented in a transmit coil 1702 of the local MRI RF coil 1618. Further, the local MRI RF coil 1618 further comprises a receive coil 1704.

The current-control circuit 102 may, for example, be as in any one or combination of FIGS. 1, 2A, 2B, 3, 4A, 4B, 5, 6A-6C, 7, 8A-8E, 9, 10A, and 10B. In some embodiments, the transmit coil 1702 is a birdcage coil as in FIGS. 14A and 14C, FIGS. 14B and 14C, FIGS. 15A and 15C, or FIGS. 15B and 15C. In other embodiments, the transmit coil 1702 is an array coil as in FIGS. 11, 13A, and 13B or as in FIGS. 12, 13A, and 13B. In this case, the current-control circuit 102 allows current to flow through the transmit coil 1702 during Tx mode to create the RF signal while simultaneously reducing PIN diode current. Further, during Rx mode, the current-control circuit 102 blocks current flow through the transmit coil 1702 in order to decouple the transmit coil 1702 from the receive coil 1704, which improves Rx SNR.

Figure 18:
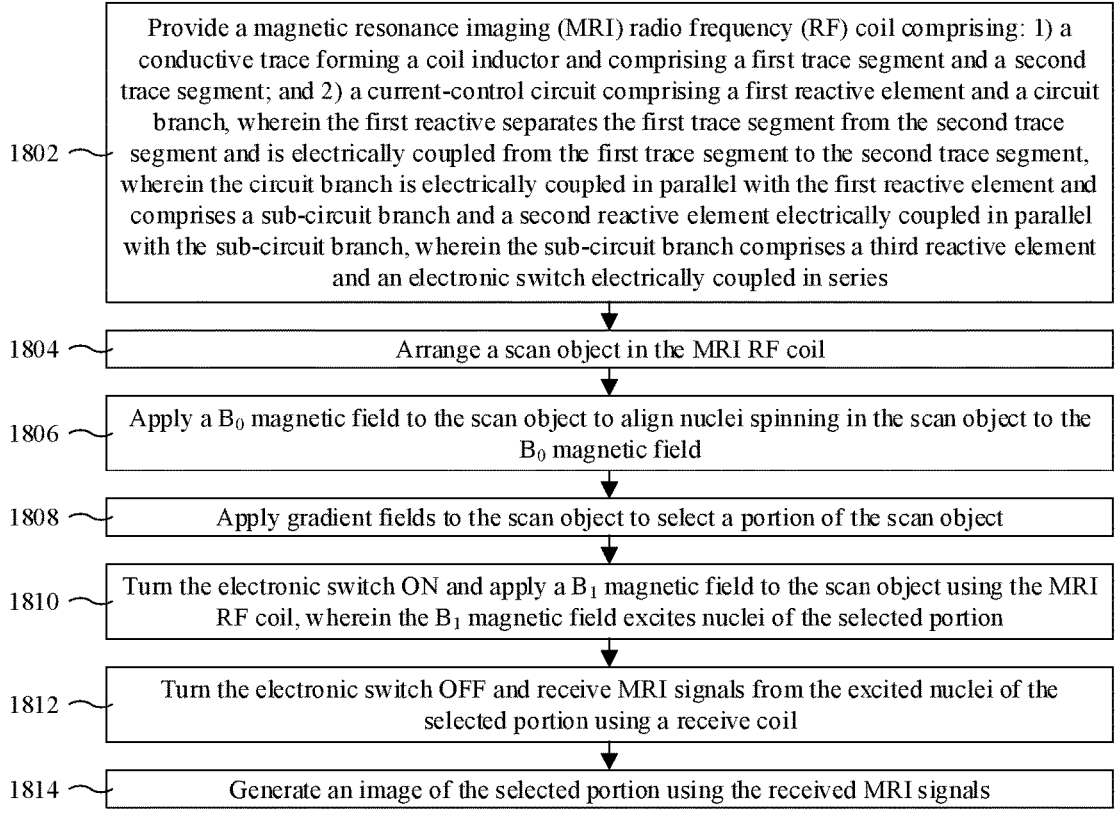
FIG. 18 is a flow diagram illustrating a method for MRI in accordance with some aspects of the present disclosure.

FIG. 18 is a flow diagram illustrating a method 1800 for MRI in accordance with some aspects of the present disclosure.

Step 1802 includes providing an MRI RF coil comprising a conductive trace and a current-reduction circuit. In some embodiments, the MRI RF coil is a birdcage coil. For example, the MRI RF coil may, for example, be the MRI RF birdcage coil 1402 of FIGS. 14A and 14C, the MRI RF birdcage coil 1402 of FIGS. 14B and 14C, the MRI RF birdcage coil 1502 of FIGS. 15A and 15C, or the MRI RF birdcage coil 1502 of FIGS. 15B and 15C. In some embodiments, the MRI RF coil is an array coil. For example, the MRI RF coil may, of example, be the MRI RF array coil 1302 of FIGS. 11, 13A, and 13B or the MRI RF array coil 1302 of FIGS. 12, 13A, and 13B. In some embodiments, the MRI RF coil is some other suitable type of coil.

The conductive trace forms a coil inductor and comprises a first trace segment and a second trace segment. The current-reduction circuit comprises a first reactive element separating the first trace segment from the second trace segment and electrically coupled from the first trace segment to the second trace segment. Further, the current-reduction circuit comprises a circuit branch electrically coupled in parallel with the first reactive element. The circuit branch comprises a second reactive element and a sub-circuit branch electrically coupled in parallel with the second reactive element. The sub-circuit branch comprises a third reactive element and an electronic switch (e.g., a PIN diode or the like) electrically coupled in series. The current-control circuit may, for example, be as described in any one or combination of FIGS. 1, 2A, 2B, 3, 4A, 4B, 5, 6A-6C, 7, 8A-8E, 9, 10A, and 10B.

Step 1804 includes arranging a scan object in the MRI RF coil.

Step 1806 includes applying a $B_0$ magnetic field to the scan object to align nuclei spinning in the scan object to the $B_0$ magnetic field.

Step 1808 includes applying gradient fields to the scan object to select a portion of the scan object.

Step 1810 includes turning the electronic switch ON and applying a $B_1$ magnetic field to the scan object using the MRI RF coil, wherein the $B_1$ magnetic field excites nuclei of the selected portion.

Step 1812 includes turning the electronic switch OFF and receiving MRI signals from the excited nuclei of the selected portion using a receive coil.

Step 1814 includes generating an image of the selected portion using the received MRI signals.

In view of the foregoing, the present disclosure is directed to an RF coil (e.g., an MRI RF coil or the like) comprising a current-control circuit.

In an Example 1, a MRI RF coil includes: a conductive trace forming a coil inductor and including a first trace segment and a second trace segment; a first reactive element separating the first trace segment from the second trace segment and electrically coupled from the first trace segment to the second trace segment; and a circuit branch electrically coupled in parallel with the first reactive element, wherein the circuit branch includes: a second reactive element; and a sub-circuit branch electrically coupled in parallel with the second reactive element, wherein the sub-circuit branch includes a third reactive element and an electronic switch that are electrically coupled in series; wherein the first reactive element and the third reactive element are one of capacitive and inductive, and wherein the second reactive element is another one of capacitive and inductive.

In an Example 2 that depends on Example 1, the second reactive element and the third reactive element are configured to resonate at a resonant frequency when the electronic switch is ON, and the first reactive element and the second reactive element are configured to resonate at the resonant frequency when the electronic switch is OFF.

In an Example 3 that depends on any one of Examples 1 and 2, the conductive trace includes a third trace segment extending from the first trace segment and the second trace segment, and the third trace segment forms the first reactive element.

In an Example 4 that depends on any one of Examples 1 and 2, the first reactive element is a discrete capacitor.

In an Example 5 that depends on any one of Examples 1, 2, and 3, the first reactive element and the third reactive element are inductive, and the second reactive element is capacitive.

In an Example 6 that depends on any one of Examples 1, 2, and 4, the first reactive element and the third reactive element are capacitive, and the second reactive element is inductive.

In an Example 7 that depends on any one of Examples 1-6, the circuit branch consists essentially of the electronic switch, the second reactive element, and the third reactive element.

In an Example 8 that depends on any one of Examples 1-6, the circuit branch further includes a fourth reactive element electrically coupled in series with a parallel combination of the sub-circuit branch and the second reactive element.

In an Example 9 that depends on any one of Examples 1-8, the MRI RF coil is a birdcage coil, and the first trace segment and the second trace segment form a rung of the birdcage coil.

In an Example 10 that depends on any one of Examples 1-8, the MRI RF coil is a birdcage coil, and the first trace segment and the second trace segment form a ring of the birdcage coil.

In an Example 11, a MRI system includes a RF coil, wherein the RF coil includes: a conductive trace forming a coil inductor and including a first trace segment and a second trace segment; a first reactive element separating the first trace segment from the second trace segment and electrically coupled from the first trace segment to the second trace segment; and a circuit branch electrically coupled in parallel with the first reactive element, wherein the circuit branch includes: a second reactive element; and a sub-circuit branch electrically coupled in parallel with the second reactive element, wherein the sub-circuit branch includes a third reactive element and an electronic switch that are electrically coupled in series; wherein the second reactive element, the third reactive element, and the electronic switch form a first loop having a first resonant frequency, and wherein the first reactive element and the second reactive element form a second loop having a second resonant frequency that is the same as the first resonant frequency.

In an Example 12 that depends on Example 11, the conductive trace includes a third trace segment and a fourth trace segment electrically coupled in parallel and extending from the first trace segment to the second trace segment, and the third and fourth trace segments collectively form the first reactive element and are separated from each other by a gap.

In an Example 13 that depends on Example 12, the conductive trace includes a fifth trace segment between the third and fourth trace segments and electrically coupled in series with a parallel combination of the sub-circuit branch and the third reactive element.

In an Example 14 that depends on Example 11, the conductive trace includes: a third trace segment extending from the first trace segment to the second trace segment and forming the first reactive element; and a fourth trace segment electrically coupled in series with a parallel combination of the sub-circuit branch and the third reactive element, wherein the fourth trace segment overlaps with the third trace segment.

In an Example 15 that depends on any one of Examples 11-14, the MRI system further includes a cylindrical former around which the RF coil is circumferentially arranged.

In an Example 16, a method for MRI includes: providing a MRI RF coil, including: a conductive trace forming a coil inductor and including a first trace segment and a second trace segment; a first reactive element separating the first trace segment from the second trace segment and electrically coupled from the first trace segment to the second trace segment; and a circuit branch electrically coupled in parallel with the first reactive element, wherein the circuit branch includes a second reactive element and a sub-circuit branch electrically coupled in parallel with the second reactive element, wherein the sub-circuit branch includes a third reactive element and an electronic switch electrically coupled in series; and performing MRI on a scan target to generate an image of the scan target, wherein the performing includes exciting nuclei in the scan target at a working frequency with the MRI RF coil and receiving MR signals from the scan target; wherein the second and third reactive elements resonate at the working frequency during the exciting, and wherein the first and second reactive elements resonate at the working frequency during the receiving.

In an Example 17 that depends on Example 16, the electronic switch is ON during the exciting, and the second and third reactive elements resonate at the working frequency to create a high impedance directing current in the conductive trace through the first reactive element.

In an Example 18 that depends on any one of Examples 16 and 17, the electronic switch is OFF during the receiving, and the first and second reactive elements resonate at the working frequency to create a high impedance blocking current flow in the conductive trace.

In an Example 19 that depends on any one of Examples 16-18, the MRI RF coil is a local transmit/receive coil, and the method further includes arranging the MRI RF coil on the scan target.

In an Example 20 that depends on any one of Examples 16-18, the MRI RF coil is a WBC of an MRI scanner and is circumferentially arranged around a bore of the MRI scanner, and the method further includes arranging the scan target in the bore of the MRI scanner.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences. Further, numerical designations (e.g., first, second, third, etc.) may be used for clarity to distinguish between components of the same type. However, it is to be appreciated that the numerical designation may vary for components displayed in multiple figures, depending upon context. For example, a component referred to as third in one figure, may be referred to as fourth in another figure if another component of the same type already has the designation of third.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) radio frequency (RF) coil, comprising:
    a conductive trace forming a coil inductor and comprising a first trace segment and a second trace segment separated by a separation;
    a first reactive element separating the first trace segment from the second trace segment, and electrically coupled from the first trace segment to the second trace segment, at the separation; and
    a circuit branch separating the first trace segment from the second trace segment, and electrically coupled in parallel with the first reactive element, at the separation, wherein the circuit branch comprises:
        a second reactive element; and
        a sub-circuit branch electrically coupled in parallel with the second reactive element, wherein the sub-circuit branch comprises a third reactive element and an electronic switch that are electrically coupled in series;
    wherein the first reactive element and the third reactive element are one of capacitive and inductive, and wherein the second reactive element is another one of capacitive and inductive.

2. The MRI RF coil of claim 1, wherein the second reactive element and the third reactive element are configured to resonate at a resonant frequency when the electronic switch is ON, and wherein the first reactive element and the second reactive element are configured to resonate at the resonant frequency when the electronic switch is OFF.

3. The MRI RF coil of claim 1, wherein the conductive trace comprises a third trace segment extending from the first trace segment and the second trace segment, and wherein the third trace segment forms the first reactive element.

4. The MRI RF coil of claim 1, wherein the first reactive element is a discrete capacitor.

5. The MRI RF coil of claim 1, wherein the first reactive element and the third reactive element are inductive, and wherein the second reactive element is capacitive.

6. The MRI RF coil of claim 1, wherein the first reactive element and the third reactive element are capacitive, and wherein the second reactive element is inductive.

7. The MRI RF coil of claim 1, wherein the circuit branch consists essentially of the electronic switch, the second reactive element, and the third reactive element.

8. The MRI RF coil of claim 1, wherein the circuit branch further comprises:
    a fourth reactive element electrically coupled in series with a parallel combination of the sub-circuit branch and the second reactive element.

9. The MRI RF coil of claim 1, wherein the MRI RF coil is a birdcage coil, and wherein the first trace segment and the second trace segment form a rung of the birdcage coil.

10. The MRI RF coil of claim 1, wherein the MRI RF coil is a birdcage coil, and wherein the first trace segment and the second trace segment form a ring of the birdcage coil.

11. A magnetic resonance imaging (MRI) system comprising a radio frequency (RF) coil, wherein the RF coil comprises:
    a conductive trace forming a coil inductor and comprising a first trace segment and a second trace segment;
    a first reactive element separating the first trace segment from the second trace segment and electrically coupled from the first trace segment to the second trace segment; and a circuit branch electrically coupled in parallel with the first reactive element, wherein the circuit branch comprises:
a second reactive element;
a sub-circuit branch electrically coupled in parallel with the second reactive element, wherein the sub-circuit branch comprises a third reactive element and an electronic switch that are electrically coupled in series; and
a cylindrical former around which the RF coil is circumferentially arranged,
wherein the second reactive element, the third reactive element, and the electronic switch form a first loop having a first resonant frequency, and wherein the first reactive element and the second reactive element form a second loop having a second resonant frequency that is the same as the first resonant frequency.

12. The MRI system of claim 11, wherein the conductive trace comprises a third trace segment and a fourth trace segment electrically coupled in parallel and extending from the first trace segment to the second trace segment, and wherein the third and fourth trace segments collectively form the first reactive element and are separated from each other by a gap.

13. The MRI system of claim 12, wherein the conductive trace comprises a fifth trace segment between the third and fourth trace segments and electrically coupled in series with a parallel combination of the sub-circuit branch and the third reactive element.

14. The MRI system of claim 11, wherein the conductive trace comprises:
a third trace segment extending from the first trace segment to the second trace segment and forming the first reactive element; and
a fourth trace segment electrically coupled in series with a parallel combination of the sub-circuit branch and the third reactive element, wherein the fourth trace segment overlaps with the third trace segment.

15. A method for magnetic resonance imaging (MRI), comprising:
providing a MRI radio frequency (RF) coil, comprising:
a conductive trace forming a coil inductor and comprising a first trace segment and a second trace segment;
a first reactive element separating the first trace segment from the second trace segment and electrically coupled from the first trace segment to the second trace segment; and
a circuit branch electrically coupled in parallel with the first reactive element, wherein the circuit branch comprises a second reactive element and a sub-circuit branch electrically coupled in parallel with the second reactive element, wherein the sub-circuit branch comprises a third reactive element and an electronic switch electrically coupled in series; and
performing MRI on a scan target to generate an image of the scan target, wherein the performing comprises exciting nuclei in the scan target at a working frequency with the MRI RF coil and receiving MR signals from the scan target;
wherein the second and third reactive elements resonate at the working frequency during the exciting, and wherein the first and second reactive elements resonate at the working frequency during the receiving.

16. The method of claim 15, wherein the electronic switch is ON during the exciting, and wherein the second and third reactive elements resonate at the working frequency to create a high impedance directing current in the conductive trace through the first reactive element.

17. The method of claim 15, wherein the electronic switch is OFF during the receiving, and wherein the first and second reactive elements resonate at the working frequency to create a high impedance blocking current flow in the conductive trace.

18. The method of claim 15, wherein the MRI RF coil is a local transmit/receive coil, and wherein the method further comprises:
arranging the MRI RF coil on the scan target.

19. The method of claim 15, wherein the MRI RF coil is a whole-body coil (WBC) of an MRI scanner and is circumferentially arranged around a bore of the MRI scanner, and wherein the method further comprises:
arranging the scan target in the bore of the MRI scanner.

20. The method of claim 15, wherein the first reactive element and the third reactive element are capacitive, and wherein the second reactive element is inductive.

* * * * *